United States Patent
Wong et al.

(10) Patent No.: US 11,175,563 B2
(45) Date of Patent: Nov. 16, 2021

(54) ALL-MICROWAVE STABILIZATION OF MICRORESONATOR-BASED OPTICAL FREQUENCY COMBS

(71) Applicant: The Regents of the University of California, Oakland, CA (US)

(72) Inventors: Chee Wei Wong, Los Angeles, CA (US); Shu-Wei Huang, Los Angeles, CA (US); Abhinav Kumar Vinod, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 167 days.

(21) Appl. No.: 16/326,056

(22) PCT Filed: Aug. 17, 2017

(86) PCT No.: PCT/US2017/047413
§ 371 (c)(1),
(2) Date: Feb. 15, 2019

(87) PCT Pub. No.: WO2018/089075
PCT Pub. Date: May 17, 2018

(65) Prior Publication Data
US 2021/0286230 A1  Sep. 16, 2021

Related U.S. Application Data

(60) Provisional application No. 62/433,114, filed on Dec. 12, 2016, provisional application No. 62/376,888, filed on Aug. 18, 2016.

(51) Int. Cl.
*G02F 1/35* (2006.01)
*H01S 5/042* (2006.01)
*H01S 5/14* (2006.01)

(52) U.S. Cl.
CPC .......... *G02F 1/3536* (2013.01); *H01S 5/0427* (2013.01); *G02F 2203/15* (2013.01); *H01S 5/14* (2013.01)

(58) Field of Classification Search
CPC .. G02F 1/3536; G02F 2203/15; H01S 5/0427; H01S 5/14
See application file for complete search history.

(56) References Cited

U.S. PATENT DOCUMENTS 7,054,009 B2   5/2006 Depue et al.
7,496,117 B2   2/2009 Tang et al.
(Continued)

FOREIGN PATENT DOCUMENTS

CN   110168444 A   8/2019
EP   3500892 A1    6/2019
(Continued)

OTHER PUBLICATIONS

Extended European Search Report for European Application No. 17865633.6, Search completed Apr. 28, 2020, dated May 8, 2020 10 pgs.
(Continued)

*Primary Examiner* — Daniel Petkovsek
(74) *Attorney, Agent, or Firm* — KPPB LLP

(57) ABSTRACT

Systems and methods in accordance with embodiments of the invention implement all-microwave stabilized microresonator-based optical frequency comb. In one embodiment, an all-microwave stabilized microresonator-based optical frequency comb includes: an optical pump configured to generate pulses of light; a microresonator including an input configured to receive pulses generated by an optical pump and an output configured to generate an optical frequency comb signal characterized by frep and ξ; where frep describes spacing of frequency components in the optical (Continued)

frequency comb; where the optical frequency comb includes a primary comb and a plurality of subcombs and $\xi$ is a frequency offset between subcombs; and two phase locked loops that phase lock frep and $\xi$ to low noise microwave oscillators by modulating output power and pump frequency of the optical pump.

17 Claims, 17 Drawing Sheets

(56) References Cited

U.S. PATENT DOCUMENTS

| | | | |
|---|---|---|---|
| 7,502,532 | B2 | 3/2009 | McCallion et al. |
| 7,684,664 | B2 | 3/2010 | Digonnet et al. |
| 7,965,914 | B2 | 6/2011 | Xu et al. |
| 9,537,571 | B2 * | 1/2017 | Li ................ H04B 10/25891 |
| 9,880,446 | B2 | 1/2018 | Gottschall et al. |
| 9,905,999 | B2 * | 2/2018 | Li .................... H01S 3/0085 |
| 10,454,238 | B2 * | 10/2019 | Fermann ............ H01S 3/1306 |
| 2011/0019957 | A1 | 1/2011 | Alameh |
| 2011/0255554 | A1 | 10/2011 | Delfyett |
| 2012/0039344 | A1 | 2/2012 | Kian et al. |
| 2013/0003766 | A1 | 1/2013 | Savchenkov et al. |
| 2014/0064734 | A1 | 3/2014 | Witzens |
| 2014/0110572 | A1 | 4/2014 | Li et al. |
| 2015/0030040 | A1 | 1/2015 | Zhou et al. |
| 2015/0338202 | A1 | 11/2015 | Xiang et al. |
| 2016/0011489 | A1 | 1/2016 | Herr et al. |
| 2016/0147014 | A1 | 5/2016 | Ptasinski et al. |
| 2016/0327743 | A1 | 11/2016 | Kippenberg et al. |
| 2017/0329086 | A1 | 11/2017 | Latawiec et al. |
| 2018/0006424 | A1 | 1/2018 | Vahala et al. |
| 2018/0083599 | A1 | 3/2018 | Kippenberg et al. |
| 2019/0296512 | A1 | 9/2019 | Wong et al. |

FOREIGN PATENT DOCUMENTS

| | | |
|---|---|---|
| EP | 3532895 A1 | 9/2019 |
| WO | 2018081824 A1 | 5/2018 |
| WO | 2018089075 A1 | 5/2018 |
| WO | 2019046645 A1 | 3/2019 |
| WO | 2019180655 A1 | 9/2019 |
| WO | 2020097241 A1 | 5/2020 |

OTHER PUBLICATIONS

Extended European Search Report for European Application No. 17869363.6 Search completed Feb. 28, 2020, dated Mar. 9, 2020, 9 Pgs.

International Preliminary Report on Patentability for International Application PCT/US2018/048954, Report issued Mar. 3, 2020, dated Mar. 12, 2020, 5 Pgs.

International Preliminary Report on Patentability for International Application PCT/US2017/047413, Report issued Feb. 19, 2019, dated Feb. 28, 2019, 5 Pgs.

International Preliminary Report on Patentability for International Application PCT/US2017/059390, Report issued Apr. 30, 2019, dated May 9, 2019, 6 Pgs.

International Search Report and Written Opinion for International Application No. PCT/US2019/060128, Search completed Jan. 13, 2020, dated Jan. 28, 2020, 10 Pgs.

International Search Report and Written Opinion for International Application No. PCT/US2017/047413, Search completed Apr. 11, 2018, dated Apr. 26, 2018, 10 Pgs.

International Search Report and Written Opinion for International Application No. PCT/US2017/059390, Search completed Jan. 26, 2018, dated Feb. 9, 2018, 12 Pgs.

International Search Report and Written Opinion for International Application No. PCT/US2018/048954, Search completed Oct. 28, 2018, dated Nov. 15, 2018, 11 Pgs.

Alnis et al., "Thermal-noise-limited crystalline whispering-gallery-mode resonator for laser stabilization", Physical Review A, vol. 84, No. 011804(R), 2011, pp. 011804-1-011804-4.

Aranson et al., "The World of the Complex Ginzburg-Landau Equation", Reviews of Modern Physics, vol. 74, No. 1, Jan. 2002, pp. 99-143, doi: 10.1103/RevModPhys.74.99.

Bale et al., "Dissipative dispersion-managed solitons in mode-locked lasers", Optics Letters, vol. 34, No. 21, Nov. 1, 2009, pp. 3286-3288, doi: 10.1364/OL.34.003286.

Brasch et al., "Photonic Chip-Based Optical Frequency Comb Using Soliton Cherenkov Radiation", Science, vol. 351, No. 6271, Jan. 22, 2016, pp. 357-360, doi: 10.1126/science.aad4811.

Capmany et al., "Microwave photonics combines two worlds", Nature Photonics, vol. 1, Jun. 1, 2007, pp. 319-330.

Chembo et al., "Modal expansion approach to optical-frequency-comb generation with monolithic whispering-gallery-mode resonators", Physics Review A, vol. 82, 2010, pp. 033801-1-033801-18.

Chong et al., "All-normal-dispersion femtosecond fiber laser with pulse energy above 20 nJ", Optics Letters, vol. 32, No. 16, Aug. 15, 2007, pp. 2408-2410, doi: 10.1364/OL.32.002408.

Coen et al., "Modeling of octave-spanning Kerr frequency combs using a generalized mean-field Lugiato-Lefever model", Optics Letters, Jan. 2013, vol. 38, Retrieved from: https://arxiv.org/abs/1211.1697, pp. 1-4.

Coillet et al., "Azimuthal Turing Patterns, Bright and Dark Cavity Solitons in Kerr Combs Generated with Whispering-Gallery-Mode Resonators", IEEE Photonics Journal, vol. 5, No. 4, Aug. 2013, pp. 6100409-1-6100409-10.

Conforti et al., "Modulational instability in dispersion oscillating fiber ring cavities", Optical Letters, vol. 39, May 2014, pp. 4200-4203.

Cundiff et al., "Experimental evidence for soliton explosions", Physical Review Letters, vol. 88, No. 7, Feb. 18, 2002, pp. 073903-1-073903-4, doi 10.1103/PhysRevLett.88.073903.

Cundiff et al., "Optical arbitrary waveform generation", Nature Photonics, vol. 4, Nov. 2010, Published Online: Oct. 29, 2010, pp. 760-765.

Del'Haye et al., "Full Stabilization of a Microresonator-Based Optical Frequency Comb", Physical Review Letters, vol. 101, No. 053903, Aug. 1, 2008, pp. 053903-1-053903-4.

Del'Haye et al., "Optical frequency comb generation from a monolithic microresonator", Nature, vol. 450, Dec. 20, 2007, pp. 1214-1217.

Del'Haye et al., "Phase Coherent Link of an Atomic Clock to a Self-Referenced Microresonator Frequency Comb", Nature, vol. 450, Dec. 20, 2007, pp. 1214-1217.

Del'Haye et al., "Phase-coherent microwave-to-optical link with a self-referenced microcomb", Nature Photonics, vol. 10, Aug. 2016, pp. 516-520.

Diddams et al., "Direct Link between Microwave and Optical Frequencies with a 300 THz Femtosecond Laser Comb", Physical Review Letters, vol. 84, No. 22, May 29, 2000, pp. 5102-5105.

Diddams et al., "Standards of Time and Frequency at the Outset of the 21st Century", Science, vol. 306, Nov. 19, 2004, pp. 1318-1324.

Du et al., "Tunability Analysis of a Graphene-Embedded Ring Modulator", IEEE Photonics Technology Letters, vol. 26, No. 20, Oct. 15, 2014, pp. 2008-2011.

Dudley et al., "Instabilities, breathers and rogue waves in optics", Nature Photonics, vol. 8, Sep. 28, 2014, pp. 755-764, doi: 10.1038/nphoton.2014.220.

Ferdous et al., "Spectral line-by-line pulse shaping of on-chip microresonator frequency combs", Nature Photonics, vol. 5, Dec. 2011, Published Online: Oct. 9, 2011, pp. 770-776.

Fescenko et al., "Dual-mode temperature compensation technique for laser stabilization to a crystalline whispering gallery mode resonator", Optics Express, vol. 20, No. 17, Aug. 13, 2012, pp. 19185-19193.

Gilbert et al., "Hydrogen Cyanide H13C14N Absorption Reference for 1530 nm to 1565 nm Wavelength Calibration—SRM 2519a", NIST Special Publication 260-137, Aug. 2005, 29 pgs.

Godey et al., "Stability analysis of the spatiotemporal Lugiato-Lefever model for Kerr optical frequency combs in the anomalous

(56) References Cited

OTHER PUBLICATIONS and normal dispersion regimes", Physical Review A, vol. 89, No. 063814, 2014, pp. x063814-1-x063814-21.
Grelu et al., "Dissipative solitons for mode-locked lasers", Nature Photonics, vol. 6, Feb. 1, 2012, pp. 1-9, doi: 10.1038/nphoton.2011. 345.
Gu et al., "Regenerative oscillation and four-wave mixing in graphene optoelectronics", Nature Photonics, vol. 6, Aug. 2012, pp. 554-559.
Hanson, "Dyadic Green's Functions and Guided Surface Waves for a Surface Conductivity Model of Graphene", Journal of Applied Physics, vol. 103, No. 064302, 2008, pp. 064302-1-064302-8.
Haus et al., "Stretched-Pulse Additive Pulse Mode-Locking in Fiber Ring Lasers: Theory and Experiment", IEEE Journal of Quantum Electronics, vol. 31, No. 3, Mar. 1995, pp. 591-598, doi: 10.1109/3.364417.
Haus et al., "Structures for additive pulse mode locking", Journal of the Optical Society of America, vol. 8, No. 10, Oct. 1991, pp. 2068-2076, doi: 10.1364/JOSAB.8.002068.
Hendry et al., "Coherent Nonlinear Optical Response of Graphene", Physical Review Letters, vol. 105, No. 097401, Aug. 27, 2010, pp. 097401-1-097401-4.
Herr et al., "Temporal solitons in optical microresonators", Nature Photonics, vol. 8, Feb. 2014, Published Online: Dec. 22, 2013, pp. 145-152, doi: 10.1038/nphoton.2013.343.
Herr et al., "Universal formation dynamics and noise of Kerr-frequency combs in microresonators", Nature Photonics, vol. 6, Jun. 24, 2012, pp. 480-487.
Holzwarth et al., "Optical Frequency Synthesizer for Precision Spectroscopy", Physical review Letters, vol. 85, No. 11, Sep. 11, 2000, pp. 2264-2267.
Huang et al., "A broadband chip-scale optical frequency synthesizer at 2.7 x 10-16 relative uncertainty", Sciences Advances, Apr. 22, 2016, vol. 2, e1501489, pp. 1-7.
Huang et al., "A low-phase-noise 18 GHz Kerr frequency microcomb phase-locked over 65 THz", Scientific Reports, vol. 5, No. 13355, Aug. 27, 2015, pp. 1-7.
Huang et al., "Globally Stable Microresonator Turing Pattern Formation of Coherent High-Power THz Radiation On-Chip", Physical Review X, vol. 7, 2017, 25 pgs.
Huang et al., "High-energy pulse synthesis with sub-cycle waveform control for strong-field physics", Nature Photonics, vol. 5, Aug. 2011, Published Online: Jul. 24, 2011, pp. 475-479.
Huang et al., "Mode-Locked Ultrashort Pulse Generation from On-Chip Normal Dispersion Microresonators", Physical Review Letters, Feb. 6, 2015, vol. 114, pp. 053901-1-053901-5.
Huang et al., "Phase stabilization of Kerr frequency comb internally without nonlinear optical interferometry", arXiv.org, Retrieved from https://arxiv.org/abs/1611.02858, Nov. 9, 2016, 30 pgs., pp. 1-6, 9, 15-17.
Huang et al., "Smooth and flat phase-locked Kerr frequency comb generation by higher order mode suppression", Scientific Reports, vol. 6, No. 26255, May 16, 2016, pp. 1-7.
Ideguchi et al., "Coherent Raman spectro-imaging with laser frequency combs", Nature, vol. 502, 2013, pp. 355-358.
Ilday et al., "Self-Similar Evolution of Parabolic Pulses in a Laser", Physical Review Letters, vol. 92, No. 21, May 28, 2004, pp. 213902-1-213902-4, doi: 10.1103/PhysRevLett.92.213902.
Jones et al., "Carrier-Envelope Phase Control of Femtosecond Mode-Locked Lasers and Direct Optical Frequency Synthesis", Science, vol. 288, Apr. 28, 2000, pp. 635-639.
Joshi et al., "Thermally controlled comb generation and soliton modelocking in microresonators", Optics Letters, vol. 41, No. 11, Jun. 1, 2016, pp. 2565-2568.
Jung et al., "In-resonator variation of waveguide cross-sections for dispersion control of aluminum nitride micro-rings", Optics Express, vol. 23, No. 24, Nov. 30, 2015, pp. 30634-30640.
Karpov et al., "Universal dynamics and deterministic switching of dissipative Kerr solitons in optical microresonators", Nature Physics, vol. 13, Sep. 2016, pp. 1-6, doi 10.1038/nphyS3893.

Kim et al., "High-Performance Flexible Graphene Field Effect Transistors with Ion Gel Gate Dielectrics", Nano Letters, vol. 10, No. 9, Aug. 12, 2010, pp. 3464-3466, Abstract, p. 3464 col. 2, p. 3465 col. 2, p. 3466 col. 1.
Kippenberg et al., "Microresonator-Based Optical Frequency Combs", Science, vol. 332, Apr. 29, 2011, pp. 555-559.
Kordts et al., "Higher order mode suppression in high-Q anomalous dispersion SiN microresonators for temporal dissipative Kerr soliton formation", Optics Letters, vol. 41, No. 3, Feb. 1, 2016, pp. 452-455.
Krausz et al., "Attosecond metrology: from electron capture to future signal processing", Nature Photonics, vol. 8, Mar. 2014, Published Online: Feb. 28, 2014, pp. 205-213.
Lamont et al., "Route to stabilized ultrabroadband microresonator-based frequency combs", Optics Letters, vol. 38, No. 18, 2013, 5 pgs.
Lee, "Colloidal superlattices for unnaturally high-index metamaterials at broadband optical frequencies", Optics Express, vol. 23, No. 22, Nov. 2, 2015, published Oct. 19, 2015, pp. 28170-28181.
Li et al., "A laser frequency comb that enables radial velocity measurements with a precision of 1 cm s-1", Nature, vol. 452, Apr. 3, 2008, pp. 610-612.
Li et al., "Optimization of adiabatic microring resonators with few-mode and high-Q resonances", Applied Optics, vol. 54, No. 34, Dec. 1, 2015, pp. 10207-10212.
Liang et al., "High spectral purity Kerr frequency comb radio frequency photonic oscillator", Nature Communications, vol. 6, No. 7957, Aug. 11, 2015, pp. 1-8.
Liu et al., "Investigation of mode coupling in normal-dispersion silicon nitride microresonators for Kerr frequency comb generation", Optica, vol. 1, No. 3, Sep. 2014, pp. 137-144.
Liu et al., "Plasmon resonance enhanced multicolour photodetection by graphene", Nature Communications, vol. 2, No. 579, Dec. 6, 2011, pp. 1-7.
Manzoni et al., "Coherent pulse synthesis: towards sub-cycle optical waveforms", Laser & Photonics Reviews, vol. 9, No. 2, 2015, pp. 129-171.
Matsko et al., "On timing jitter of mode locked Kerr frequency combs", Optics Express, vol. 21, No. 23, Nov. 18, 2013, pp. 28862-28876.
Mikhailov et al., "A new electromagnetic mode in graphene", arXiv.org, Retrieved from: https://arXiv:cond/0703406, Mar. 15, 2007, 5 pgs.
Mikkelsen et al., "Adiabatically widened silicon microrings for improved variation tolerance", Optics Express, vol. 22, No. 8, Apr. 21, 2014, pp. 9659-9666.
Moss et al., "New CMOS-compatible platforms based on silicon nitride and Hydex for nonlinear optics", Nature Photonics, vol. 7, Aug. 2013, Published Online: Jul. 30, 2013, pp. 597-607.
Ooi et A., "Waveguide engineering of graphene's nonlinearity", Applied Physics Letters, vol. 105, No. 111110, Sep. 18, 2014, pp. 111110-1-111110-4.
Papp et al., "Microresonator frequency comb optical clock", Optica, vol. 1, No. 1, Jul. 22, 2014, pp. 10-14.
Papp et al., "Parametric seeding of a microresonator optical frequency comb", Optics Express, vol. 21, No. 15, Jul. 29, 2013, pp. 17615-17624.
Parra-Rivas et al., "Dynamics of localized and patterned structures in the Lugiato-Lefever equation determine the stability and shape of optical frequency combs", Physical Review A, vol. 89, No. 043813, Jan. 2014, pp. 043813-1-043813-12.
Parra-Rivas et al., "Third-order chromatic dispersion stabilizes Kerr frequency combs", Optics Letters, vol. 39, No. 10, 2014, 5 pgs., arXiv: 1403.0903.
Pfeifle et al., "Coherent terabit communications with microresonator Kerr frequency combs", National Photonics, vol. 8, No. 5, May 1, 2014, 13 pgs.
Piglosiewics et al., "Carrier-envelope phase effects on the strong-field photoemission of electrons from metallic nanostructures", Nature Photonics, vol. 8, Jan. 2014, Published Online: Nov. 10, 2013, pp. 37-42.

(56) References Cited

OTHER PUBLICATIONS

Roy et al., "Dynamics of periodic pulse collisions in a strongly dissipative-dispersive system", Physical Review Letters, May 27, 2005, vol. 94, No. 20, pp. 203903-1-203903-4, doi: 10.1103/PhysRevLett.94.203903.
Saha et al., "Modelocking and femtosecond pulse generation in chip-based frequency combs", Optics Express, vol. 21, No. 1, Jan. 14, 2013, pp. 1335-1343.
Salem et al., "Application of space-time duality to ultrahigh-speed optical signal processing", Advances in Optics and Photonics, vol. 5, No. 3, 2013, pp. 274-317.
Skryabin et al., "Colloquium: Looking at a soliton through the prisms of optical supercontinuum", Review of Modern Physics, vol. 82, Apr. 2010, pp. 1287-1299.
Solli et al., "Optical rogue waves", Nature, vol. 450, Dec. 13, 2007, pp. 1054-1057, doi: 10.1038/nature06402.
Song et al., "Impact of pulse dynamics on timing jitter in mode-locked fiber lasers", Optics Letters, vol. 36, No. 10, May 15, 2011, pp. 1761-1763.
Suh et al., "Soliton Microcomb Range Measurement", Science, vol. 359, No. 6378, Feb. 23, 2018, pp. 884-887.
Tamura et al., "77-fs pulse generation from a stretched-pulse mode-locked all-fiber ring laser", Optics Letters, vol. 18, No. 13, Jul. 1, 1993, pp. 1080-1082, doi: 10.1364/OL.18.001080.
Trocha et al., "Ultrafast Optical Ranging Using Microresonator Soliton Frequency Combs", Science, vol. 359, No. 6378, Feb. 23, 2018, pp. 887-891, p. 1, col. 1-2, p. 2, col. 1, Fig 1B, 2A.
Udem et al., "Optical frequency metrology", Nature, vol. 416, Mar. 14, 2002, pp. 233-237.
Vakil et al., "Transformation optics using graphene", Science, vol. 332, No. 6035, Jun. 10, 2011, pp. 1291-1294.
Bao et al., "Nonlinear conversion efficiency in Kerr frequency comb generation", Optics Letters, vol. 39, No. 21, 2014, pp. 6126-6129.
Bao et al., "Stretched cavity soliton in dispersion-managed Kerr resonators", Phys. Rev., Aug. 3, 2015, vol. A 92, 7 pgs.
Birch et al., "An Updated Edlén Equation for the Refractive Index of Air", Metrologia, Jan. 1993, vol. 30, No. 3, pp. 155-162, DOI: 10.1088/0026-1394/30/3/004.
Bobroff, "Recent advances in displacement measuring interferometry", Meas. Sci. Technol., 1993, vol. 4, No. 9, pp. 907-926.
Bolotin et al., "Ultrahigh electron mobility in suspended graphene", Solid State Communications, 2008, vol. 146, Issues 9-10, pp. 351-355, available online Mar. 6, 2008, doi: 10.1016/j.ssc.2008.02.024.
Brash et al., "Photonic chip-based optical frequency comb using soliton Cherenkov radiation", Science, Jan. 22, 2016, vol. 351, Issue 6271, pp. 357-360, DOI: 10.1126/science.aad4811.
Chakraborty et al., "Gain modulation by graphene plasmons in aperiodic lattice lasers", Science, Jan. 15, 2016, vol. 351, Issue 6270, pp. 246-248, doi: 10.1126/science.aad2930.
Ciddor et al., "Refractive index of air: new equations for the visible and near infrared", Applied Optics, Mar. 20, 1996, vol. 35, No. 9, pp. 1566-1573, doi 10.1364/AO.35.001566.
Coddington et al., "Coherent Multiheterodyne Specroscopy Using Stabilized Optical Frequency Combs", Physical Review Letters, Jan. 11, 2008, vol. 100, No. 1, pp. 013902-1-013902-4.
Coddington et al., "Rapid and precise absolute distance measurements at long range", Nature Photonics, Jun. 2009, vol. 3, pp. 351-356, published online May 24, 2009, DOI: 10.1038/nphoton.2009.94.
Coen et al., "Modulational Instability Induced by Cavity Boundary Conditions in a Normally Dispersive Optical Fiber", Physical Review Letters, vol. 79, No. 21, Nov. 24, 1997, pp. 4139-4142.
Cole et al., "Soliton crystals in Kerr resonators", Nature Photonics, Sep. 25, 2017, vol. 11, pp. 671-676, DOI:10.1038/s41566-017-0009-z.
Das et al., "Monitoring dopants by Raman scattering in an electrochemically top-gated graphene transistor", Nature Nanotechnology, Apr. 2008, vol. 3, pp. 210-215, published online Mar. 30, 2008, doi: 10.1038/nnano.2008.67.

Del Haye et al., "Optical Frequency Comb Generation from a Monolithic Microresonator", Nature, 2007, vol. 450, pp. 1214-1217, arXiv:0708.0611, Aug. 4, 2007.
Diddams et al., "An Optical Clock Based on a Sigle Trapped 199Hg+ Ion", Science, Aug. 3, 2001, vol. 203, pp. 825-828.
Doloca et al., "Absolute distance measurement system using a femtosecond laser as a modulator", Measurement Science and Technology, Sep. 24, 2010, vol. 21, No. 11, 115302, 7 pgs.
Erkinatalo et al., "Cascaded Phase Matching and Nonlinear Symmetry Breaking in Fiber Frequency Combs", Physical Review Letters, Nov. 30, 2012, vol. 109, No. 2, first published Nov. 27, 2012, doi 10.1103/PhysRevLett.109.223904.
Gao et al., "Measurement technologies for precision positioning", CIRP Annals—Manufacturing Technology, 2015, vol. 64, Issue 2, pp. 773-796, available online Jun. 15, 2015, https://doi.org/10.1016/j.cirp.2015.05.009.
Grigorenko et al., "Graphene plasmonics", Nature Photonics, Nov. 5, 2012, vol. 6, pp. 749-758, published online Oct. 31, 2012, doi: 10.1038/nphoton.2012.262.
Han et al., "Parallel determination of absolute distances to multiple targets by time-of-flight measurement using femtosecond light pulses", Optics Express, Oct. 5, 2015, vol. 23, No. 20, pp. 25874-25882, published Apr. 23, 20015, doi: 10.1364/OE.23.025874.
Huang et al., "Universally stable microresonator Turing patters formation for coherent high-powr THz radiation on-chip", 2016, arXiv: 1603.00948, retrieved from https://www.semanticscholar.org/paper/Universally-stable-microresonator-Turing-pattern-Huang-Yang/da819648ba9b5225970c9d3cfd47fa716caf7a71, 26 pgs.
Jang et al., "Absolute Distance Meter Operating on a Free-Running Mode-Locked Laser for Space Mission", International Journal of Precise Engineering and Manufacturing, 2018, vol. 19, No. 7, pp. 975-981.
Jang et al., "Comb-referenced laser distance interferometer for industrial nanotechnology", Scientific Reports, Aug. 25, 2016, vol. 6, No. 31770, pp. 1-10, DOI:10.1038/srep31770.
Jang et al., "Compensation of the refractive index of air in laser interferometer for distance measurement: a review", International Journal of Precision Engineering and Manufacturing, Dec. 2017, vol. 18, No. 12, pp. 1881-1890, DOI: 10.1007/s12541-017-0217-y.
Jin et al., "Absolute length calibration of gauge blocks using optical comb of a femtosecond pulse laser", Optics Express, Jun. 26, 2006, vol. 14, Issue 13, pp. 5968-5974, https://doi.org/10.1364/OE.14.005968.
Joo et al., "Absolute distance measurement by dispersive interferometry using a femtosecond pulse laser", Optics Express, Jun. 26, 2006, vol. 14, No. 13, pp. 5954-5960.
Joo et al., "Distance measurements by combined method based on a femtosecond pulse laser", Optics Express, Nov. 24, 2008, vol. 16, No. 24, pp. 19799-19806, first published Nov. 14, 2008.
Kang etal, "Real-time compensation of the refractive index of air in distance measurement", Optics Express, Oct. 2015, vol. 23, No. 20, pp. 26377-26385, DOI: 10.1364/OE.23.026377.
Kim et al., "Large-scale pattern growth of graphene films for stretchable transparent electrodes", Nature, Jan. 14, 2009, vol. 457, pp. 706-710, https://doi.org/10.1038/nature07719.
Kippenberg et al., "Dissipative Kerr solitons in optical microresonators", Science, Aug. 10, 2018, vol. 361, No. 567, 13 pgs.
Koppens et al., "Photodetectors based on graphene, other two-dimensional materials and hybrid systems", Nature Nanotechnology, Oct. 2014, vol. 9, No. 10, pp. 780-793, doi:10.1038/nnano.2014.215.
Larkin et al., "Efficient nonlinear algorithm for envelope detection in white light interferometry", Journal Opt. Soc. Am. A., Apr. 1996, vol. 13, No. 4, pp. 832-843.
Lee et al., "Time-of-flight measurement with femtosecond light pulses", Nature Photonics, Oct. 2010, vol. 4, pp. 716-720, first published Aug. 8, 2010, DOI: 10.1038/nphoton.2010.175.
Lepetit et al., "Linear techniques of phase-measurement by femtosecond spectral interferometry for applications in spectroscopy", J. Opt. Soc. Am. B, Dec. 1995, vol. 12, No. 12, pp. 2467-2474.
Li et al., "Compact and stable temporally magnified tomography using phase-locked broadband source", Opt. Let, 2016, vol. 41, Issue 7, pp. 1562-1565.

(56) References Cited

OTHER PUBLICATIONS

Li et al., "Dirac charge dynamics in graphene by infrared spectroscopy", Nature Physics, Jul. 2008, vol. 4, pp. 532-535, published online Jun. 8, 2008, doi:10.31038/nphys989.

Liu et al., "A graphene-based broadband optical modulator", Nature, May 11, 2011, vol. 474, pp. 64-67, doi:10.1038/nature10067.

Liu et al., "Sub-micron absolute distance measurements in sub-millisecond times with dual free-running femtosecond Er fiber-lasers", Optics Express, Sep. 12, 2011, vol. 19, No. 19, pp. 18501-18509, first published Sep. 7, 2011.

Marin-Palomo et al., "Microresonator-based solitons for massively parallel coherent optical communications", Nature Jun. 8, 2017, vol. 546, pp. 274-279, DOI: 10.1038/nature22387.

Mikhailov et al., "New Electromagnetic Mode in Graphene", Physical Review Letters, Jul. 6, 2007, vol. 99, 016803, pp. 016803-1-016803-4, doi: 10.1103/PhysRevLett.99.016803.

Minoshima et al., "High-accuracy measurement of 240-m distance in an optical tunnel by use of a compact femtosecond laser", Applied Optics, Oct. 20, 2000, vol. 39, No. 30, pp. 5512-5517.

Phare et al., "Graphene electro-optic modulator with 30 GHz bandwidth", Nature Photonics, Aug. 2015, vol. 9, pp. 511-514, published online Jul. 13, 2015, doi: 10.1038/nphoton.2015.122.

Schuhler et al., "Frequency-comb-referenced two-wavelength source for absolute distance measurement", Optics Letters, 2006, vol. 31, Issue 21, pp. 3101-3103, https://doi.org/10.1364/OL.31.003101.

Spencer et al., "An optical-frequency synthesizer using integrated photonics", Nature, 2018, vol. 557, pp. 81-85.

Stern et al., "Battery-operated integrated frequency comb generator", Nature, Oct. 2018, vol. 562, No. 7727, pp. 401-405. Epub Oct. 8, 2018, doi: 10.1038/s41586-018-0598-9.

Suh et al., "Microresonator soliton dual-comb spectroscopy", Science, Nov. 4, 2016, vol. 354, Issue 6312, pp. 600-603, DOI: 10.1126/science.aah6516, arXiv:1607.08222, Jul. 27, 2016.

Wang et al., "Absolute positioning by multi-wavelength interferometry referenced to the frequency comb of a femtosecond laser", Optics Express, Apr. 6, 2015, vol. 23, No. 7, pp. 9121-9129, first published Apr. 1, 2015, doi: 10.1364/OE.23.009121.

Wu et al., "Extremely high-accuracy correction of air refractive index using two-colour optical frequency combs", Scientific Reports, May 30, 2013, vol. 3, No. 1894, DOI: 10.1038/srep01894.

Xu et al., "Holey graphene frameworks for highly efficient capacitive energy storage", Nature Communications, Aug. 8, 2014, vol. 5, Article No. 4554, pp. 1-8, doi: 10.1038/ncomms5554.

Yang et al., "Counter-propagating solitons in microresonators", Nature Photonics, 2017, vol. 11, pp. 560-564, arX14:1704.08409, May 2, 2017.

Yang et al., "Stokes solitons in optical microcavities", Nature Physics, Jan. 2017, vol. 13, pp. 53-58, published Sep. 5, 2016, DOI: 10.1038/NPHYS3875.

Yao et al., "Gate-tunable frequency combs in graphene-nitride microresonators", Nature, Jun. 21, 2018, vol. 558, pp. 410-414, https://doi.org/10.1038/s41586-018-0216-x.

Wabnitz, "Suppression of interactions in a phase-locked soliton optical memory", Optics Letters, vol. 18, No. 8, Apr. 15, 1993, pp. 601-603.

Wei et al., "Precision and broadband frequency swept laser source based on high-order modulation-sideband injection-locking", Optics Express, vol. 23, No. 4, Feb. 17, 2015, pp. 4970-4980, see pp. 4970-4973.

Wirth et al., "Synthesized Light Transients", Science, vol. 334, Oct. 14, 2011, pp. 195-200.

Wu et al., "Dissipative soliton resonance in an all-normal-dispersion erbium-doped fiber laser", Optics Express, vol. 17, No. 7, published Mar. 24, 2009, pp. 5580-5584, doi: 10.1364/OE.17.005580.

Wu et al., "Generation of cascaded four-wave-mixing with graphene-coated microfiber", Photonics Research, vol. 3, No. 2, Apr. 2015, pp. A64-A68.

Xuan et al., "High-Q silicon nitride microresonators exhibiting low-power frequency comb initiation", Optica, vol. 3, No. 11, Nov. 2016, pp. 1171-1180.

Xue et al., "Mode-locked dark pulse Kerr combs in normal-dispersion microresonators", Nature Photonics, vol. 9, Aug. 10, 2015, pp. 594-600, doi: 10.1038/nphoton.2015.137.

Yang et al., "An all-optical modulation method in sub-micron scale", Scientific Reports, vol. 5, No. 9206, Mar. 17, 2015, pp. 1-5.

Yao et al., "Graphene based widely-tunable and singly-polarized pulse generation with random fiber lasers", Scientific Reports, vol. 5, No. 18526, Dec. 21, 2015, pp. 1-8.

Yao et al., "Graphene Bragg gratings on microfiber", Optics Express, vol. 22, No. 20, Oct. 6, 2014, published Sep. 22, 2014, pp. 23829-23835.

Yariv, "Critical Coupling and Its Control in Optical Waveguide-Ring Resonator Systems", IEEE Photonics Technology Letters, vol. 14, No. 4, Apr. 2002, pp. 483-485.

Ye et al., "Femtosecond Optical Frequency Comb Technology", Springer, New York, NY, 2005, 370 pgs.

Yi et al., "Soliton frequency comb at microwave rates in a high-Q silica microresonator", Optica, vol. 2, No. 12, Dec. 2015, pp. 1078-1085, doi: 10.1364/OPTICA.2.001078.

Yu et al., "Dispersion-managed soliton interactions in optical fibers", Optics Letters, vol. 22, No. 11, Jun. 1, 1997, pp. 793-795, doi: 10.1364/OL.22.000793.

Zhang et al., "Generation of two-cycle pulses and octave spanning frequency combs in a dispersion-flattened micro-resonator", Optics Letters, vol. 38, No. 23, Dec. 1, 2013, pp. 5122-5125.

Zhou et al., "Stability and intrinsic fluctuations of dissipative cavity solitons in Kerr frequency microcombs", IEEE Photonics Journal, vol. 7, No. 3, Jun. 2015, 13 pgs.

\* cited by examiner

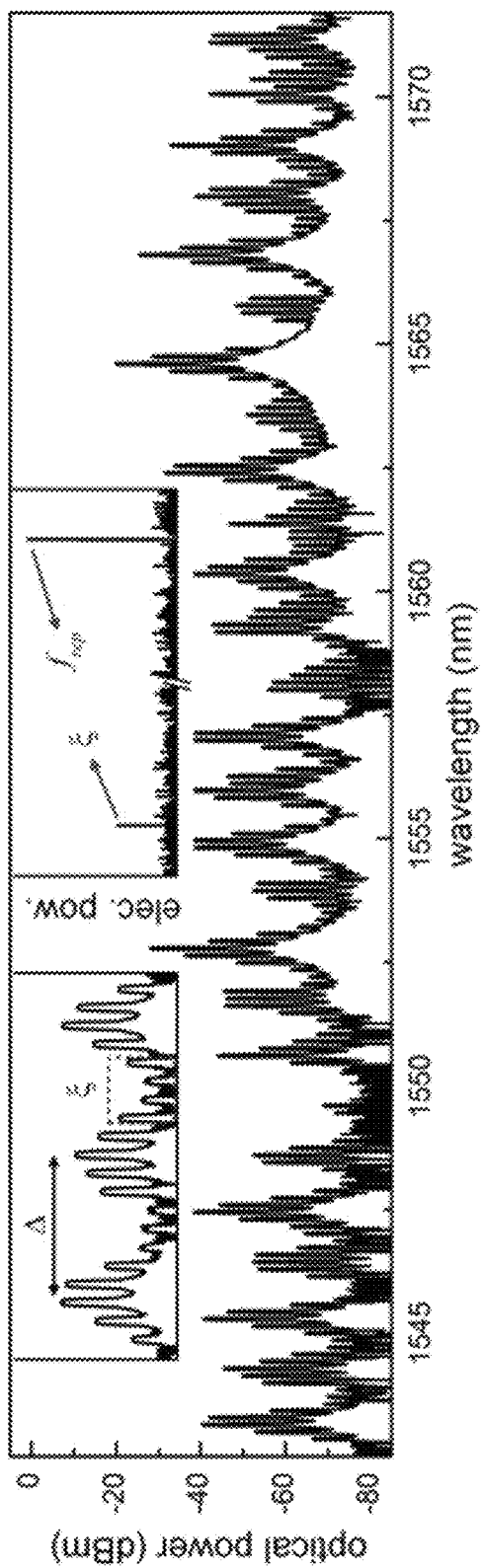
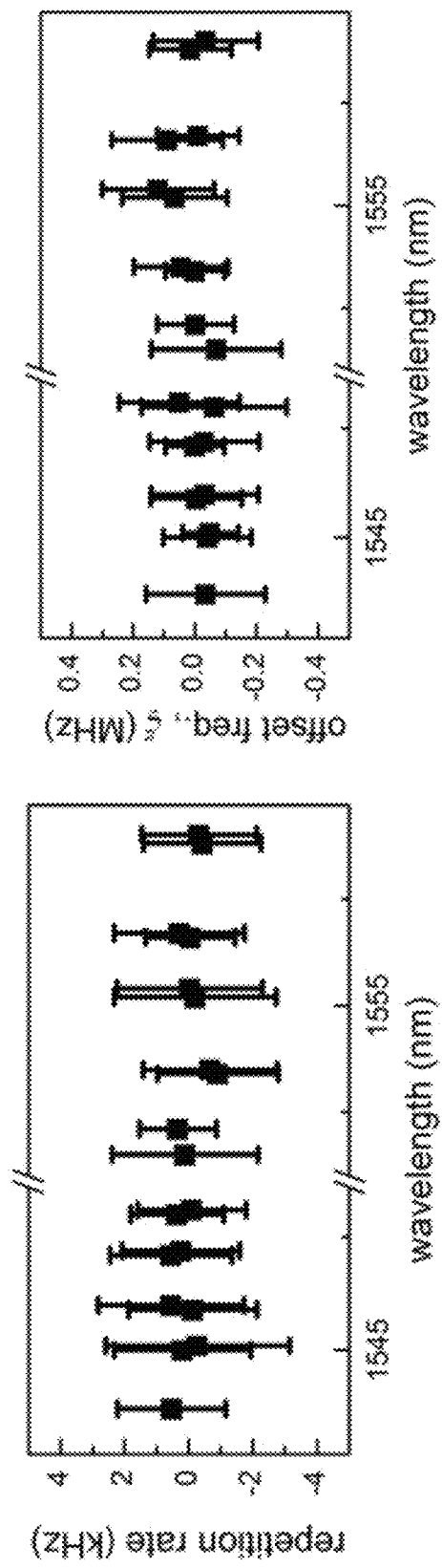
FIG. 7A
FIG. 7B
FIG. 7C

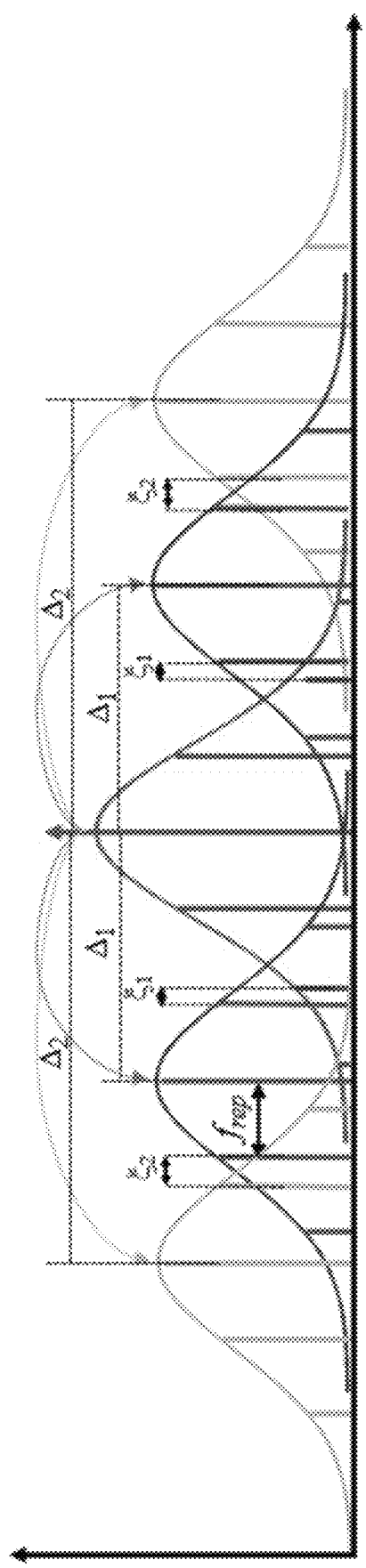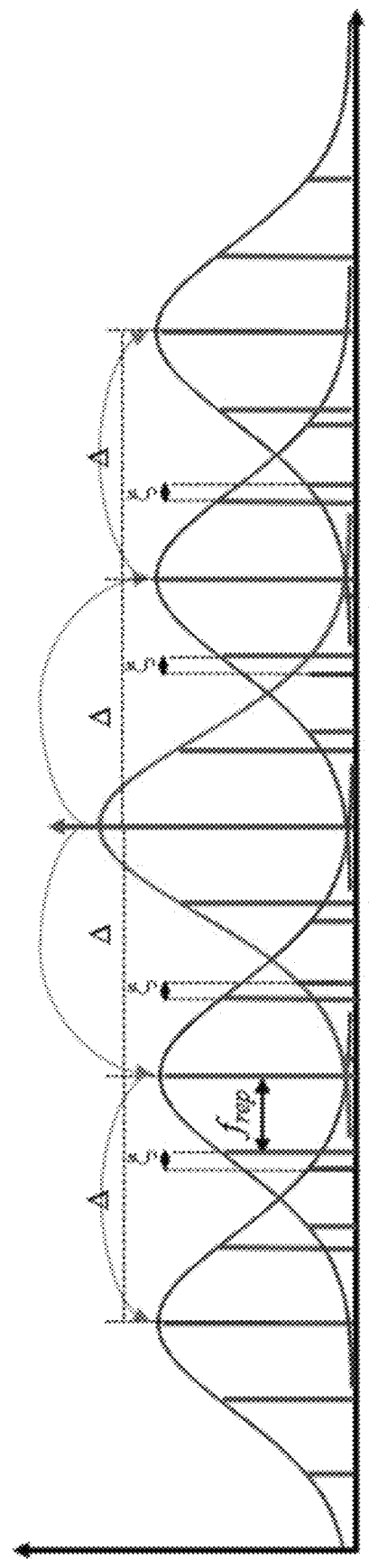

ALL-MICROWAVE STABILIZATION OF MICRORESONATOR-BASED OPTICAL FREQUENCY COMBS

CROSS REFERENCE TO RELATED APPLICATIONS

This application is a national stage of PCT Patent Application No. PCT/US2017/047413, entitled "All-Microwave Stabilization of Microresonator-based Optical Frequency Combs" to Wong et al., filed Aug. 17, 2017, which claims priority to U.S. Provisional Application No. 62/433,114, entitled "All-Microwave Stabilization of Microresonator-based Optical Frequency Combs" to Wong et al., filed Dec. 12, 2016, and U.S. Provisional Application No. 62/376,888, entitled "All Microwave Stabilization of Chip-Scale Frequency Combs" to Wong et al., filed Aug. 18, 2016, the disclosures of which are incorporated by reference herein in their entirety.

STATEMENT OF FEDERALLY SPONSORED RESEARCH

This invention was made with Government support under Grant Number FA9550-15-1-0081, awarded by the U.S. Air Force, Office of Scientific Research and grant number N00014-16-1-2094 awarded by U.S. Navy, Office of Naval Research. The Government has certain rights in the invention.

FIELD OF THE INVENTION

The present invention generally relates to optical frequency combs.

BACKGROUND

An optical frequency comb is an optical spectrum that consists of discrete, evenly spaced spectral lines corresponding with electromagnetic frequency values (e.g. in the optical frequency portion of the electromagnetic spectrum). Optical frequency combs can be used to accurately measure much higher frequencies of electromagnetic waves than those that many other tools can measure. FIG. 1 illustrates a typical optical frequency comb, which can be entirely characterized by an offset and a repetition rate (e.g. as depicted in FIG. 1).

Usually, an optical frequency comb is derived from a train of ultrashort electromagnetic pulses, having a fixed pulse repetition rate. In particular, the Fourier transform of the train of ultrashort electromagnetic pulses can result in the desired optical frequency comb: the length of each pulse can correspond with the optical frequency comb's bandwidth, while the pulse repetition rate can be correlated with the line spacing within the comb. Thus, for example, a femtosecond pulse can span an entire octave. FIG. 2 conceptually illustrates the derivation of an optical frequency comb. In particular, FIG. 2 illustrates a train of ultrashort electromagnetic pulses in time. Note that pulses are characterized by an electromagnetic wave form within a Gaussian envelope. Moreover, note that the electromagnetic wave form within each pulse embodies a phase shift relative to adjacent pulses. By conducting a Fourier transform on the train of pulses, the corresponding frequency comb can be achieved, and is illustrated. In particular, the offset of the frequency comb is equal to the referenced phase shift of the electromagnetic waveform within the Gaussian envelope; in this context, the phase shift can be referred to as a "carrier envelope offset." The 'intertooth' spacing is equal to the time between pulses.

In general, the frequency domain of an optical frequency comb can usually be fully characterized by:

$$f(n) = f_{ceo} + n f_{rep}$$

where:
n is an integer;
$f_{rep}$ is the comb tooth spacing; and
$f_{ceo}$ is the carrier envelope offset, which is less than $f_{rep}$.

SUMMARY OF THE INVENTION

Systems and methods in accordance with many embodiments of the invention implement all-microwave stabilized microresonator-based optical frequency combs. In one embodiment, an all-microwave stabilized microresonator-based optical frequency comb includes: an optical pump configured to generate pulses of light; a microresonator including an input configured to receive pulses generated by an optical pump and an output configured to generate an optical frequency comb signal characterized by $f_{rep}$ and $\xi$; where $f_{rep}$ describes spacing of frequency components in the optical frequency comb; where the optical frequency comb includes a primary comb and a plurality of subcombs and $\xi$ is a frequency offset between subcombs; and two phase locked loops that phase lock $f_{rep}$ and $\xi$ to low noise microwave oscillators by modulating output power and pump frequency of the optical pump.

In a further embodiment, the optical pump output power is modulated using an electro-optical modulator.

In a still further embodiment, the optical pump includes an external cavity diode laser (ECDL).

In a yet further embodiment, the pump frequency is controlled via a diode current of the ECDL.

In a yet further embodiment again, respective intrinsic offset frequencies $\xi$ are uniquely defined and resemble corresponding carrier envelope offset frequencies, $f_{ceo}$ after the stabilization of respective repetition frequencies, $f_{rep}$.

In another embodiment again, pump power $P_p$ and pump frequency $f_p$ are implemented such that only a single set of respective primary comb lines is generated, resulting in the unique definition of a respective intrinsic offset frequency, $\xi$.

In a yet further embodiment, the offset frequency $\xi$ is in the RF domain.

In another embodiment again, the primary comb lines are separated by $\Delta$ and a secondary comb line is spaced by $f_{rep}$, wherein $\Delta$ is not an integer multiple of $f_{rep}$ and the frequency comb exhibits a single intrinsic offset frequency, $\xi$.

In another embodiment still, the all-microwave stabilized microresonator-based optical frequency comb uses additional slow feedback through the gain of an erbium-doped fiber amplifier (EDFA) and a piezoelectric transducer (PZT) of an ECDL to extend the stable operation time of the phase-locked loops.

In still a further embodiment, the control units of the slow feedback loops are the EDFA gain and the PZT.

In another embodiment still, the all-microwave stabilized microresonator-based optical frequency comb utilizes PI²D control servos for feedback in the $f_{rep}$ and $\xi$ phase lock loops.

In another embodiment, to isolate the microresonator from ambient thermal fluctuations, the chip is mounted on a temperature-controlled chip-holder and enclosed in an acrylic chamber.

In yet another embodiment, the offset frequency, ξ, is linked with the primary comb line spacing, Δ, by the constitutive relation $$\xi = \Delta - \left\lfloor \frac{\Delta}{f_{rep}} \right\rfloor f_{rep}.$$

In still yet another embodiment again, a proportional integral corner frequency is set lower than that of the $f_{rep}$ stabilization loop to reduce the crosstalk between the two phase-locked loops.

In a further additional embodiment, multiple mode-spaced combs are formed comprising several subcomb families with incommensurate spacing between them.

In still a further additional embodiment, a first set of primary comb lines are formed at an offset of $\Delta_1$ from the pump and a second set are formed at an offset of $\Delta_2$ from the pump, wherein $\Delta_2$ is not a multiple of $\Delta_1$ and neither $\Delta_2$ nor $\Delta_1$ are integral multiples of $f_{rep}$, and two offset beats $\xi_1$ and ξ are generated by beating of subcombs with each other.

In a still yet further embodiment, only the first set of primary comb lines is formed due to modulation instability via the pump, and all other primary comb lines are generated via cascaded four-wave mixing between the pump and the first set of primary comb lines, which allows for a single offset ξ throughout the comb.

BRIEF DESCRIPTION OF THE DRAWINGS

FIGS. 7A-7C illustrate data in relation to a microresonator-based frequency comb in the telecommunication C-band wavelength range in accordance with certain embodiments of the invention.

FIGS. 11A-11B illustrate the formation of multiple mode-spaced combs in accordance with certain embodiments of the invention.

DETAILED DESCRIPTION

Figure 1:
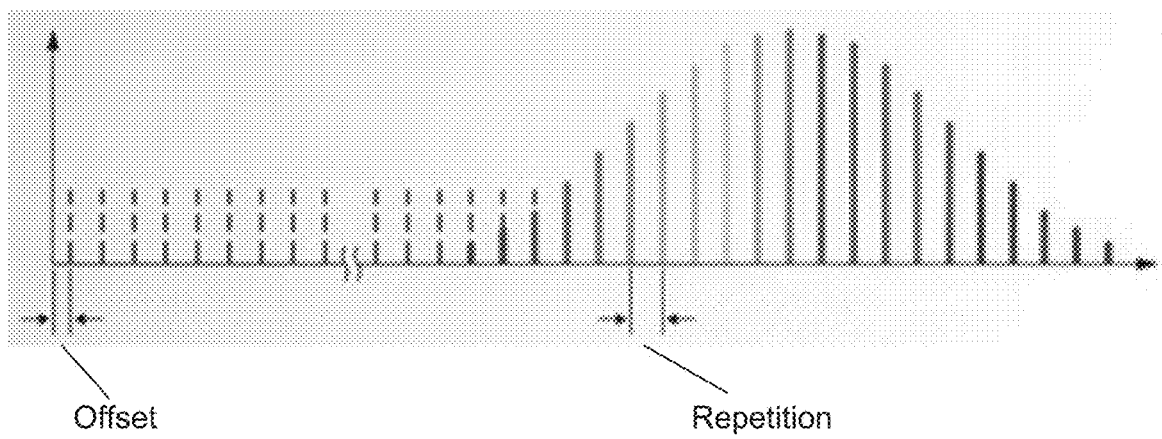
FIG. 1 illustrates a conventional optical frequency comb.
Figure 2:
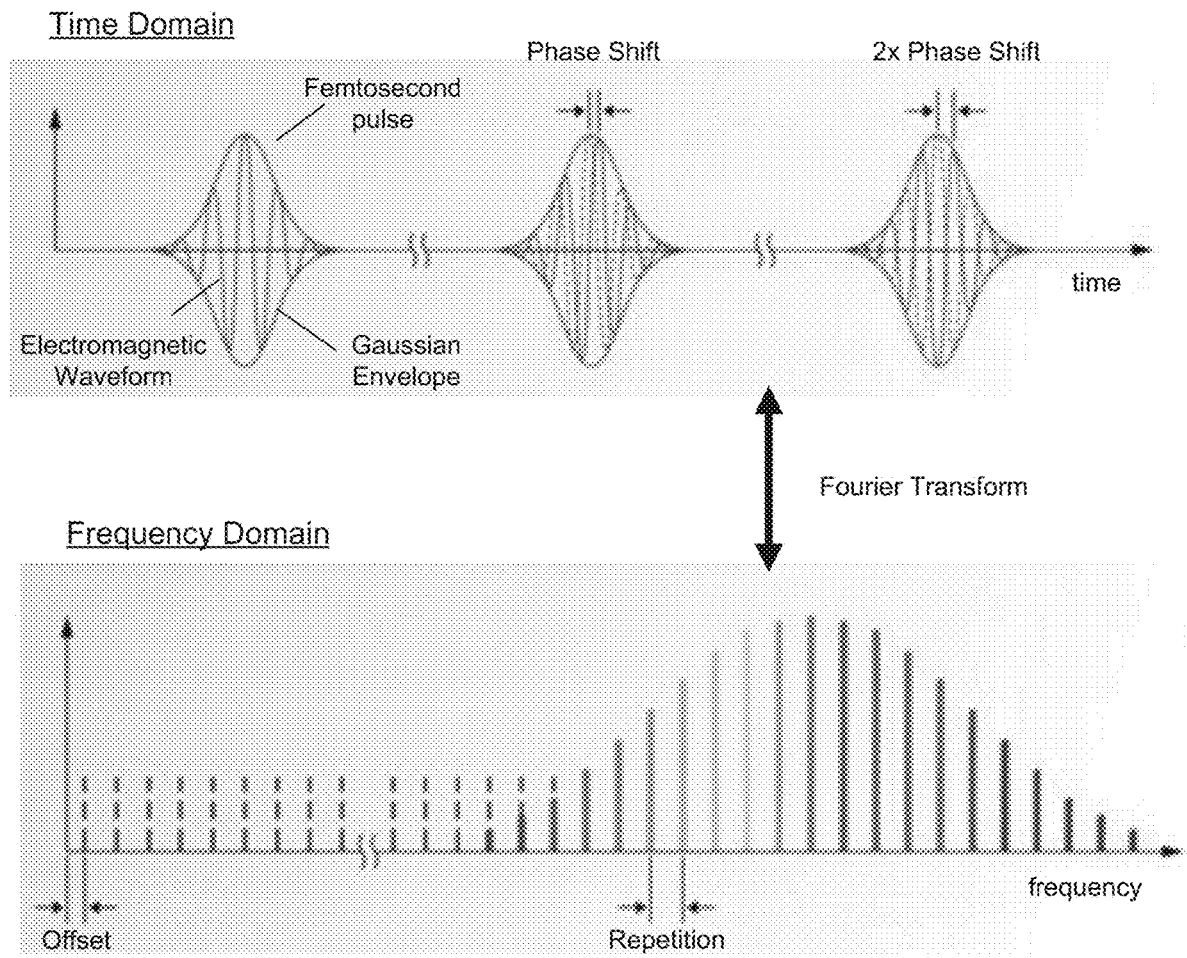
FIG. 2 illustrates the derivation of a conventional optical frequency comb.
Figure 3A:
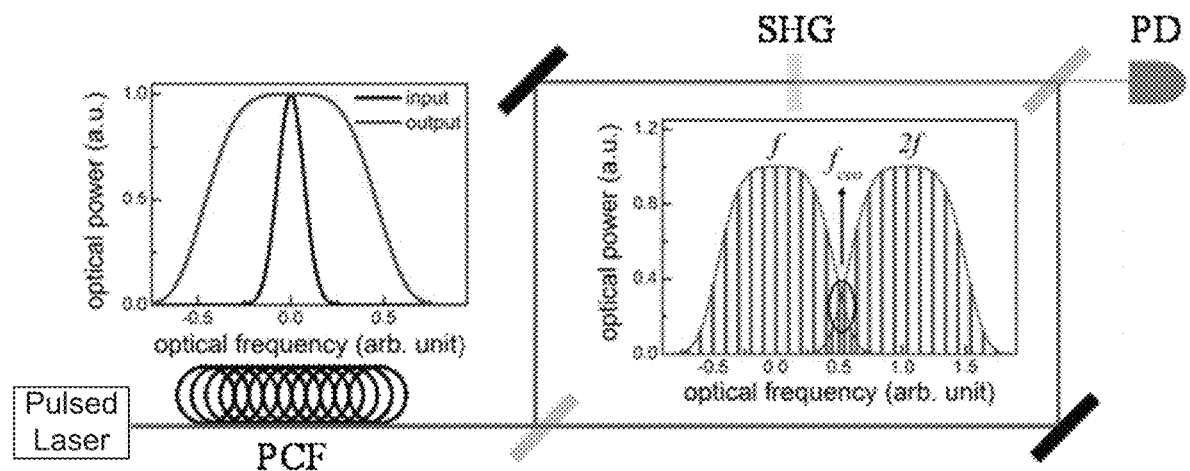
FIGS. 3A-3B illustrate an f-2f nonlinear interferometer technique that can be used to measure $f_{eco}$.
Figure 3B:
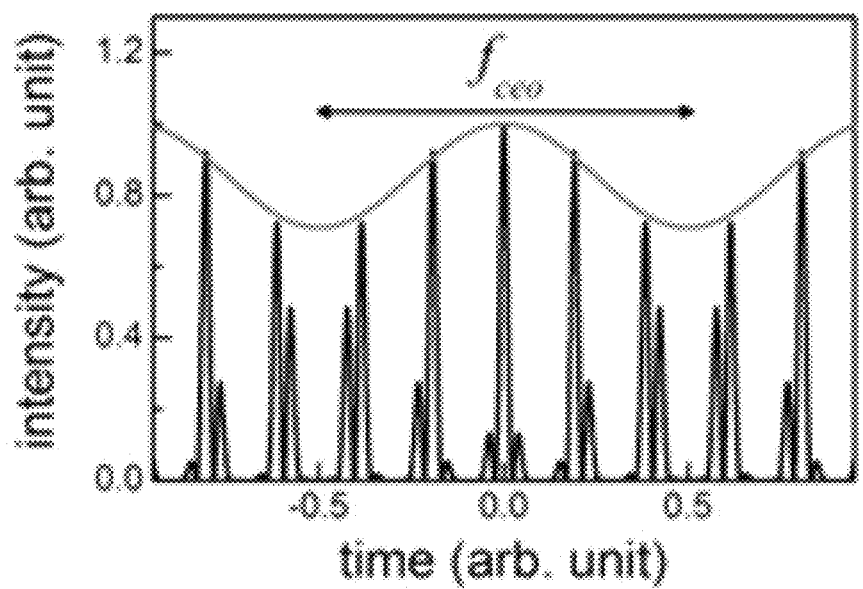

Turning now to the drawings, systems and methods for implementing self-referenced microresonator-based optical frequency combs are illustrated. Optical frequency combs have been conventionally generated using mode-locked lasers. In general mode-locked lasers produce a series of optical pulses separated in time by round-trip time of the laser cavity. A Fourier transform of the pulse train can give rise to the optical frequency comb, e.g. as illustrated in FIG. 2. Recall that the frequency within a frequency comb can generally be fully characterized by a characteristic repetition rate ($f_{rep}$) and the carrier envelop offset ($f_{eco}$) of the frequency comb. While the repetition rate can be relatively straightforwardly measured using a high-speed photodetector, the detection of the carrier envelope offset has conventionally required sophisticated nonlinear optical interferometry that itself may be intrinsically power dependent. For example, FIGS. 3A-3B illustrates an f-2f nonlinear interferometer technique that can be used to measure $f_{eco}$. In general, in accordance with the technique, output pulses from a pulse laser are spectrally broadened in a highly nonlinear photonic crystal fiber ("PCF") such that its optical spectrum spans more than an octave. Then the octave-spanning spectrum is separated into two parts: the lower-frequency end undergoes second harmonic generation ("SHG") in a nonlinear crystal while the higher frequency end only experiences free propagation. Finally, the two beams are put together in both transverse and longitudinal coordinates for them to interfere at a photodetector and generate a beat note at $f_{eco}$. In general, for this technique to work, few-cycle pulses with peak powers in the 10-kW level may be required. FIG. 3B illustrates the derived $f_{eco}$.

Figure 4A:
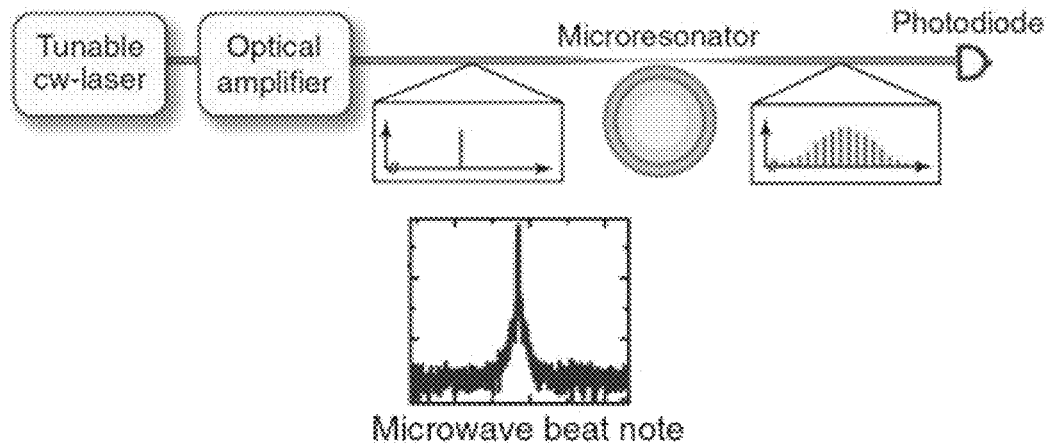
FIGS. 4A-4C illustrate the implementation of a conventional microresonator-based optical frequency comb.
Figure 4B:
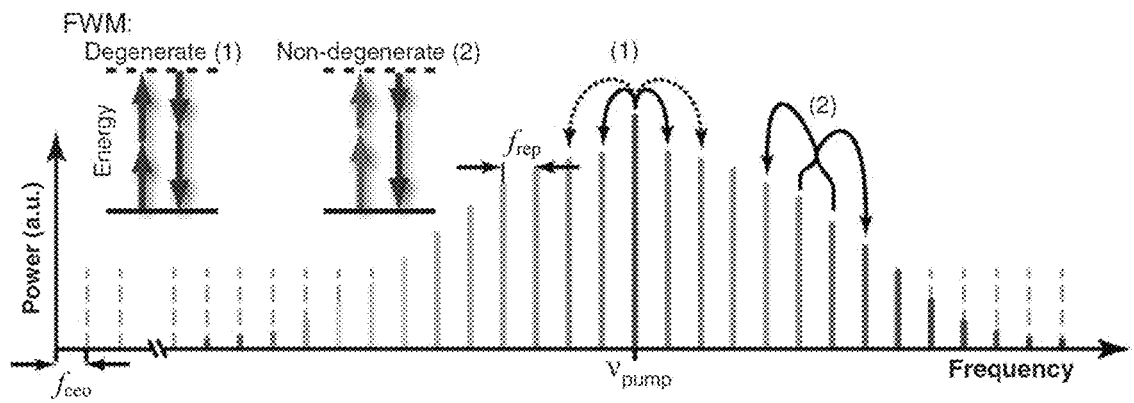
Figure 4C:
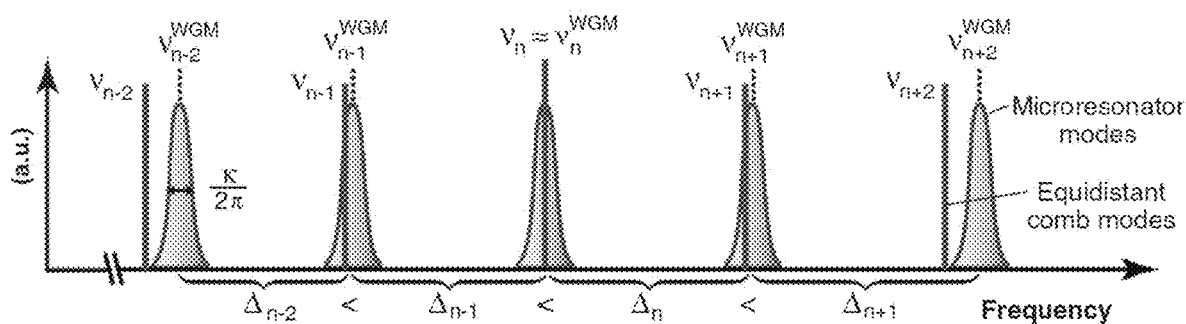

Optical Frequency Combs can also be implemented via microresonators. In particular, optical frequency combs can be produced from a continuous wave (CW) laser through the nonlinear process of parametric frequency conversion in optical microresonators that trap and confine light in small volumes and thereby enhance the light intensity and nonlinear interaction. "Microresonator-Based Optical Frequency Combs" by T. J. Kippenberg, et al. describes the operation of microresonator-based optical frequency combs. (See "Microresonator-Based Optical Frequency Combs" by T. J. Kippenberg, et al., Science 332, 555 (2011)). The disclosure of "Microresonator-Based Optical Frequency Combs" is hereby incorporated by reference in its entirety, especially as it pertains to microresonator-based optical frequency combs. As a review, FIGS. 4A-4C illustrate the operation of a conventional microresonator-based optical frequency comb. In particular, FIG. 4A illustrates that an optical microresonator is pumped with a CW laser beam. The high intensity in the resonators (~GW/cm²) gives rise to a parametric frequency conversion through both degenerate and nondegenerate (i.e., cascaded) four-wave mixing (FWM). Upon generation of an optical frequency comb spectrum, the resulting beat note (given by the inverse cavity round-trip time) can be recorded on a photodiode and used for further stabilization or directly in applications.

FIG. 4B illustrates the resulting optical frequency comb spectrum, which is characterized by the repetition rate ($f_{rep}$) and the carrier envelope frequency ($f_{eco}$). In microresonator-based frequency combs, the pump laser is generally part of the optical comb (e.g. the $0^{th}$ comb line). The comb is generated by a combination of degenerate FWM (process 1, which converts two photons of the same frequency into a frequency upshifted and downshifted pair of photons) and nondegenerate FWM (process 2, in which all four photons have different frequencies). The presence of cascaded FWM is the underlying process that couples the phases of all modes in the comb and allows transfer of the equidistant mode spacing across the entire comb.

FIG. 4C illustrates a schematic of the microresonator modes and the frequency comb components generated by pumping a whispering-gallery mode with a pump laser. The mode index (n) refers to the number of wavelengths around the microresonator's perimeter. The FWM process results in equidistant sidebands. The bandwidth of the comb can be limited by variation of the resonator's free spectral range ($\Delta_n$) with wavelength due to dispersion (shown is the case of anomalous dispersion).

While microresonator-based optical frequency combs are approaching the performance of conventional mode-locked laser-based optical frequency combs in many aspects, their output pulse duration and peak power are still lower by orders of magnitude. As a result, application of f-2f and 2f-3f nonlinear interferometer techniques can be challenging and power demanding. Recently multiple stages of high power erbium doped fiber amplifiers (EDFAs) have been implemented to boost the peak power of the microresonator-based frequency combs. Unfortunately, these modifications typically reduce the size, weight, and power advantages that conventional microresonator-based optical frequency comb apparatus can possess. Accordingly, in many embodiments of the invention, systems and methods are implemented that allow for self-referenced microresonator-based optical frequency combs. For example, in many embodiments of the invention, microresonator-based optical frequency combs are generated that are characterized by a single RF beatnote that corresponds to the $f_{eco}$ of the frequency comb. In this way, $f_{eco}$ can be determined without the use of sophisticated nonlinear optical interferometry. In general, the disclosed techniques can circumvent conventional requirements of high-peak-power, few-cycle pulses, while preserving key advantages that microresonator-based optical frequency combs can offer.

The development of all-microwave stabilized microresonator-based optical frequency combs is now discussed in greater detail below.

All-Microwave Stabilized Microresonator-Based Optical Frequency Combs

In many embodiments of the invention, microresonator-based optical frequency combs (also referred to as "Kerr frequency combs") are implemented whereby respective intrinsic offset frequencies, $\xi$, are uniquely defined and resemble corresponding carrier envelope offset frequencies, $f_{eco}$, after the stabilization of respective repetition frequencies, $f_{rep}$. In many embodiments, the pump power $P_p$ and the pump frequency $f_p$ are particularly implemented such that only a single set of respective primary comb lines is generated, resulting in the unique definition of a respective intrinsic offset frequency, $\xi$. In many embodiments, $f_{rep}$ and $\xi$ are phase locked to low noise microwave oscillators, thereby facilitating the optical frequency stability of the Kerr frequency comb.

Figure 5A:
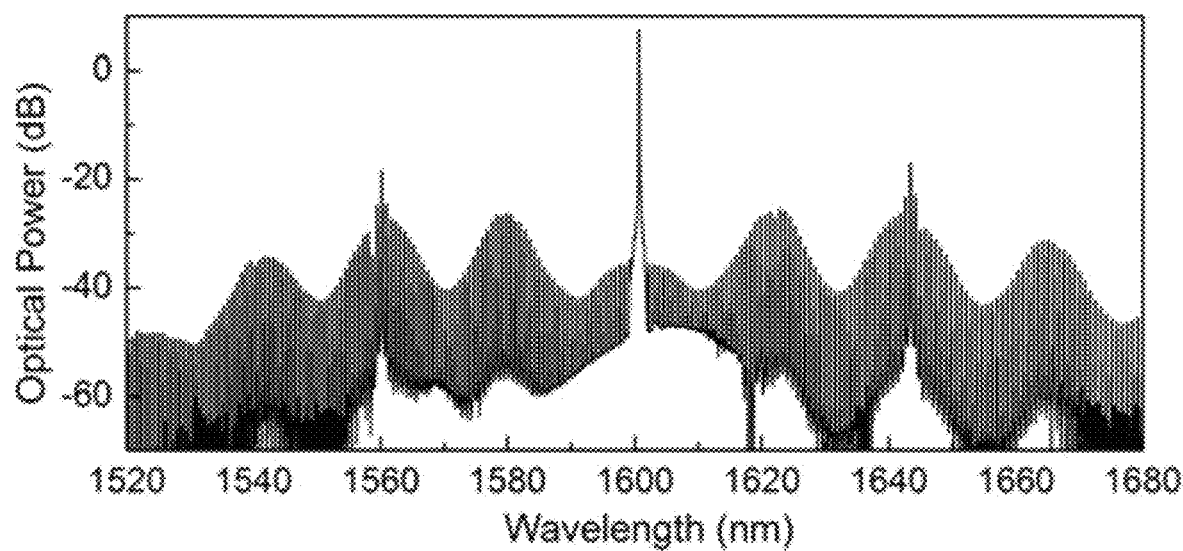
FIGS. 5A-5B illustrate that a microresonator-based frequency comb can be made to be characterized by a single offset beat in addition to $f_{rep}$, that this ability is not a unique property dependent on microresonator characteristics but is universal and arises from the mechanics of frequency comb generation, and that this insight can be harnessed in accordance with many embodiments of the invention.
Figure 5B:
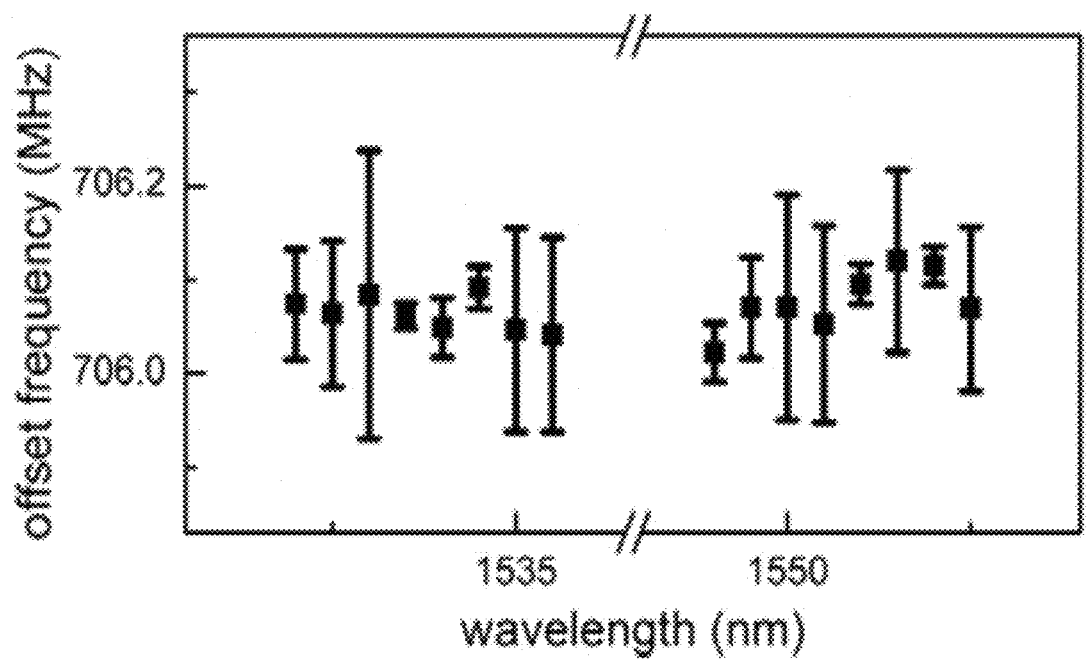

FIG. 5A illustrates a spectrum of a comb-state, generated in a single mode microresonator with a tapered structure. This comb state generates a single offset beat $\xi$ in the RF domain in addition to the repetition rate. FIG. 5B verifies that the offset frequency is uniquely defined across the whole Kerr frequency comb; it reflects measurements at various different spectral segments with a tunable filter (0.22 nm FWHM filter bandwidth). Free-running $\xi$ without $f_{rep}$ stabilization (~700 MHz) in different spectral regions is measured to be the same within error bars of ~200 kHz. At wavelengths where the beat notes have SNR higher than 10 dB (100 kHz RBW), ten measurements are taken to determine the mean value of the offset frequency. The error bar of the measurement is defined as the peak-to-peak deviation from the 10 measurements.

Figure 6:
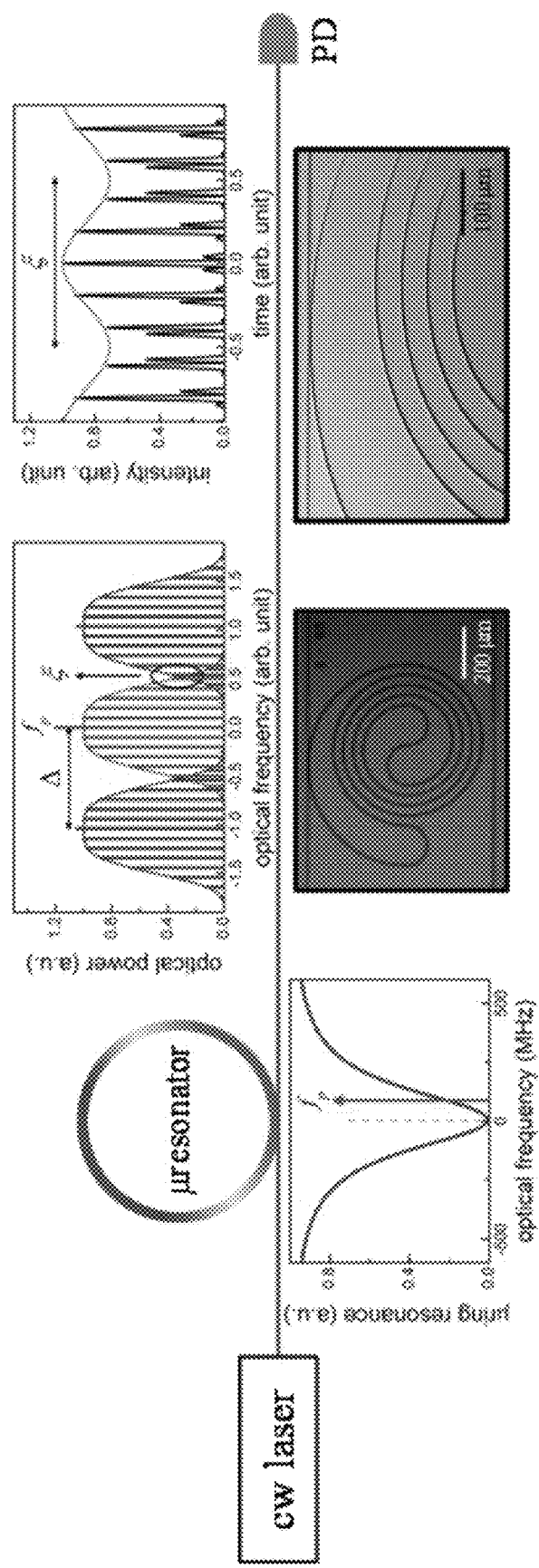
FIG. 6 illustrates the implementation of a microresonator-based frequency comb characterized by a single offset beat in accordance with certain embodiments of the invention.

FIG. 6 conceptually illustrates the development of a microresonator-based frequency comb characterized by a uniquely defined intrinsic offset frequency, $\xi$, which resembles the corresponding carrier envelope offset frequency. In particular, it is depicted that a continuous wave laser is emanated through a microresonator; modulation instability and four-wave mixing result in the formation of primary comb lines separated by $\Delta$ and secondary comb lines spaced by $f_{rep}$. In general, $\Delta$ is not an integer multiple of $f_{rep}$ and thus the frequency comb exhibits a single intrinsic offset frequency, $\xi$. While one configuration is depicted, it should be clear that any configuration can be implemented that results in the generation of a unique intrinsic offset value $\xi$ in accordance with embodiments of the invention.

FIG. 7A illustrates a microresonator-based frequency comb in the telecommunication C-band wavelength range. The formation of primary comb lines with $\Delta$=1.1 nm and overlap between secondary comb lines are depicted. The electrical spectrum of the microresonator-based frequency comb measures two distinct beat notes of $f_{rep}$–17.9 GHz and $\xi$=523.35 MHz. FIGS. 7B and 7C reflect efforts to verify that both the comb spacing and the offset frequency are uniquely defined across the microresonator based frequency comb. In particular, the offset frequencies and comb spacings are measured at various different spectral segments with a tunable filter (0.22 nm FWHM filter bandwidth). Free-running $f_{rep}$ and $\xi$ at different spectral regions are measured to be the same within error bars of ~2 kHz and 200 kHz, respectively. At wavelengths where the beat notes have SNR higher than 10 dB (100 kHz RBW), 10 measurements were taken to determine the mean values of the comb spacing and the offset frequencies. The error bar of the measurement is defined as the peak-to-peak deviation from the 10 measurements.

Figure 8A:
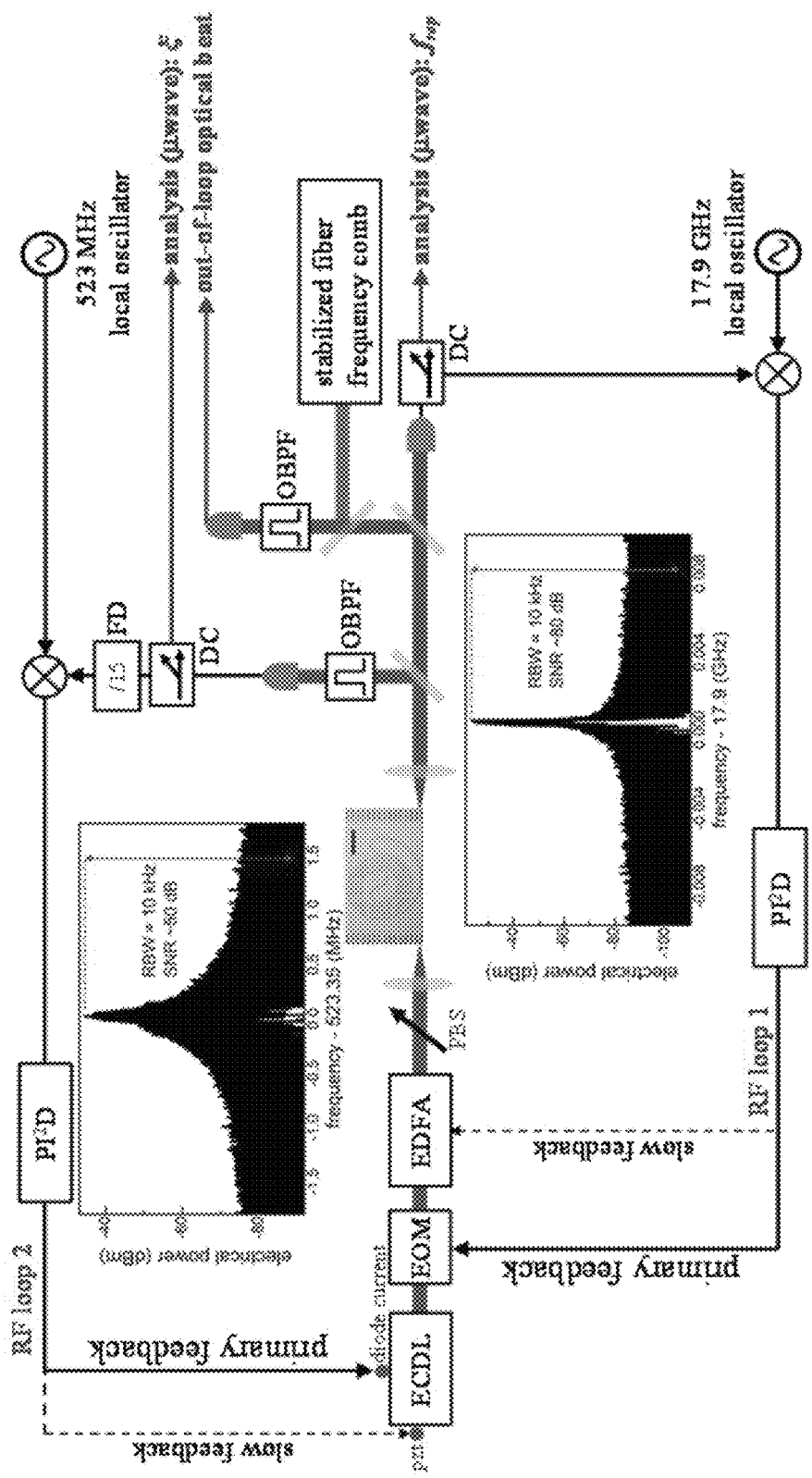
FIGS. 8A-8D illustrate the implementation of a particular configuration for a microresonator-based frequency comb in accordance with certain embodiments of the invention.

FIG. 8A illustrates a microresonator-based system for generating an optical frequency comb in accordance with an embodiment of the invention. In particular, FIG. 8A illustrates phase-locked loops to stabilize the $f_{rep}$ and $\xi$ are engaged with pump power regulation via an electro-optic modulator (EOM) and pump frequency control via diode current of the external cavity diode laser (ECDL), respectively. In the illustrated embodiment, additional slow feedback through the gain of the erbium-doped fiber amplifier (EDFA) and the piezoelectric transducer (PZT) of the ECDL are used to extend the stable operation time of the phase-locked loops. In the illustrated embodiment, PI$^2$D control servos are utilized for feedback in the $f_{rep}$ and $\xi$ phase lock loops. In several embodiments, the PI$^2$D control servos have 10 MHz bandwidths and two PI corners, which can suppress low frequency noise, in addition to a PD corner to increase loop stability. In many embodiments, for the $f_{rep}$ stabilization, the PI corner for the first integrator is set to 200 kHz while the second integrator is switched off. For the $\xi$ stabilization, the PI corners can be set to 500 Hz and 50 kHz to achieve higher suppression for low frequency noise. In addition, the PD corners can be set to 200 kHz and 100 kHz respectively with a differential gain of 10 dB. In a number of embodiments, the derivative control is important to make the feedback loop more stable and achieve optimal noise suppression. Due to alignment drift in the optics, the mean level of the servo output keeps increasing until the lock is lost in a few minutes. To increase the operation time, a slow feedback can be included in each loop. In certain embodiments, the slow feedback error signal is generated by integrating the servo output for 1 second. In other embodiments, the slow feedback can be generated using any of a variety of techniques appropriate to the requirements of specific applications. The control units of the slow feedback loops are the EDFA gain and the PZT, which have larger dynamic ranges than the EOM and the diode current. In other embodiments, optical pump output power and frequency can be controlled using any of a variety of techniques including (but not limited to) EOM and acousto-optic modulators. Out-of-loop stability of the microresonator-based optical frequency comb can be evaluated with heterodyne beating with an independent state-of-the-art fiber laser frequency comb (FFC). The illustrated embodiment further incorporates a polarization beamsplitter (PBS), optical bandpass filter (OBPF), directional coupler (DC), and a frequency divider (FD).

In the illustrated embodiment, a $Si_3N_4$ microresonator is implemented, which can be fabricated with CMOS-compatible processes; the spiral design can allow relatively large resonators fit into a tight field-of-view to avoid additional cavity losses introduced by photomask stitching and discretization errors. The illustrated microresonator is critically coupled with a loaded quality factor approaching 600,000 (intrinsic quality factor at 1,200,000). A 600 µm long adiabatic mode converter can be implemented to improve coupling efficiency from free space to the bus waveguide. The system can be configured such that the input-output insertion loss for the whole setup does not exceed 5.5 dB. To isolate the microresonator from ambient thermal fluctuations, the chip can be mounted on a temperature-controlled chip-holder and enclosed in an acrylic chamber. To shield it against acoustic noise and vibrations, the whole enclosure can first be placed on a sorbothane sheet and on an active-controlled optical table. As can readily be appreciated, any of a variety of techniques for reducing the effects of thermal and/or optical noise can be utilized as appropriate to the requirements of specific applications in accordance with various embodiments of the invention. The illustrated configuration depicts a 17.9 GHz comb spacing, directly measurable by sending the output to a high speed photodetector. The comb spacing can then be locked and stabilized to a microwave oscillator by controlling the pump power through a fiber EOM (primary loop) and the gain of the EDFA (slow loop). Note that the free-running offset frequency is ξ much noisier than the comb spacing $f_{rep}$ due to $$\xi = \Delta - \left\lfloor \frac{\Delta}{f_{rep}} \right\rfloor f_{rep}.$$

Again, while a certain configuration for implementing a microresonator-based optical frequency comb is depicted, any suitable configuration for implementing a microresonator-based optical frequency comb characterized by a single intrinsic offset value ξ can be implemented in accordance with various embodiments of the invention.

Figure 8B:
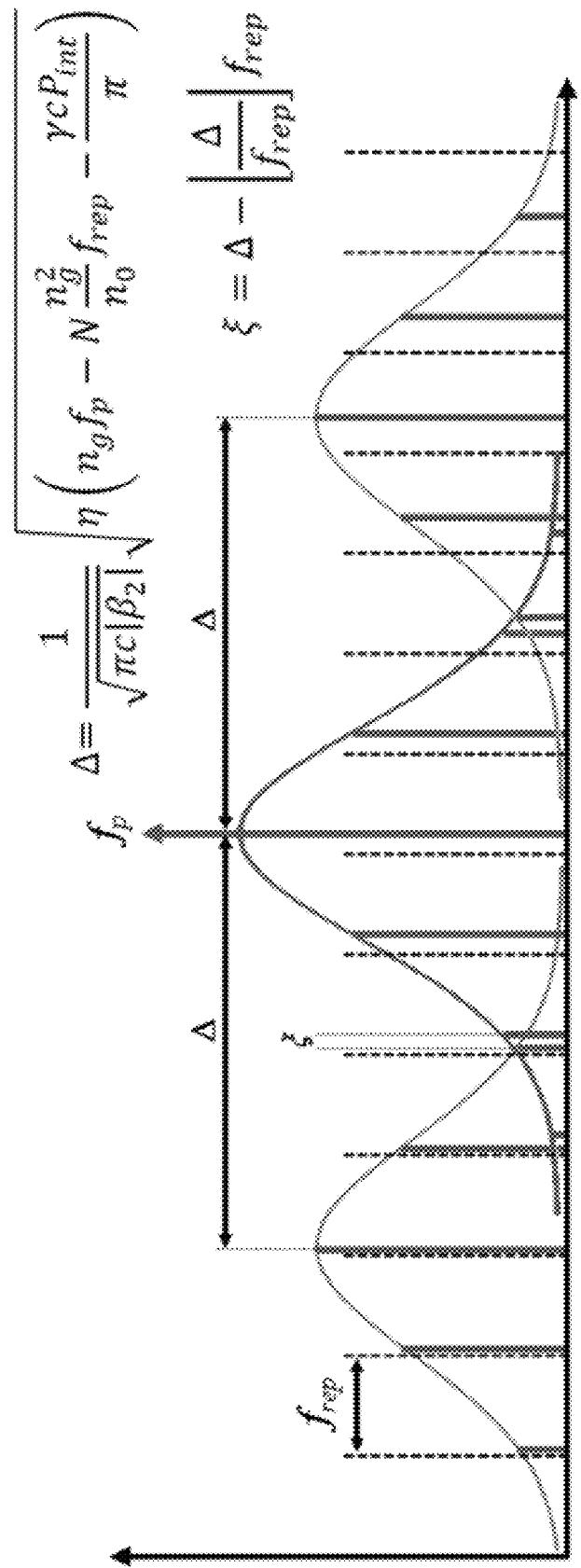

FIG. 8B conceptually illustrates a frequency domain signal generated by a microresonator-based frequency comb similar to the microresonator-based frequency comb illustrated in FIG. 8A. The offset frequency, ξ, is linked with the primary comb line spacing, Δ, by the constitutive relation $$\xi = \Delta - \left\lfloor \frac{\Delta}{f_{rep}} \right\rfloor f_{rep}.$$

Note that because of this relationship, ξ is much noisier than the comb spacing $f_{rep}$. To this end, the $f_{rep}$ stabilization loop can be engaged before measurements on the offset frequency are conducted. In the illustrated embodiment, as the offset frequency is localized to the spectral region where secondary comb lines overlap, a 0.22 nm optical bandpass filter is used to select the overlapped comb lines around 1553.5 nm for detection. The beat note is thus improved to 50 dB above the noise floor with a resolution bandwidth of 10 kHz, sufficient for a reliable feedback stabilization (more than 45 dB with 10 kHz RBW). In the illustrated embodiment, the offset frequency is divided by 15 before it is phase locked and stabilized to a microwave synthesizer. The pre-scaling can reduce the phase fluctuation, while preserving the fractional frequency instability, and thus it makes the phase-locked loop more robust against noise. The high bandwidth feedback on is achieved by direct current modulation of the external cavity diode laser (ECDL), and the slow feedback is done through piezoelectric transducer control of the ECDL. Out of loop stability of the Kerr frequency comb can be evaluated by heterodyne beating with a state-of-the-art fiber laser frequency comb (FFC). All microwave oscillators and frequency counters are commonly referenced to a rubidium-disciplined crystal oscillator with a frequency fractional instability of $5 \times 10^{-12}$ at 1 second.

The microresonator-based optical frequency comb generation mechanism can be described by the nonlinear Schrodinger equation—and the cavity boundary:

$$\frac{\partial E^n(z,t)}{\partial z} = -\frac{\alpha}{2} E^n(z,t) - i \frac{\beta_2}{2} \frac{\partial^2 E^n(z,t)}{\partial t^2} + i\gamma |E^n(z,t)|^2 E^n(z,t)$$

and $$E^{n+1}(0,t) = \sqrt{1-T} E^n(L,t) \exp(i\varphi_0) + \sqrt{T} E_i,$$

where $E^n(z,t)$ is the electric field envelope function at the nth cavity round-trip, z is the propagation, t is the retarded time, α is cavity round-trip loss, $\beta_2$ is the group velocity dispersion (GVD), γ is the nonlinear coefficient, T is transmission coefficient of the coupler, and $\varphi_0$ is the phase accumulated in a round-trip. Here the microresonator is assumed to be critically coupled, for simplicity. Under the mean-field approximation and the good cavity limit, the primary comb spacing, which depends on the optimal frequency, where modulation instability gain reaches its maximum, can be solved as:

$$\Delta = \frac{1}{\sqrt{\pi c |\beta_2|}} \sqrt{\eta \left( n_g f_p - N \frac{n_g^2}{n_0} f_{rep} - \frac{\gamma c P_{int}}{\pi} \right)},$$

where $\beta_2$ is the group velocity dispersion (GVD), $$\eta = \frac{\beta_2}{|\beta_2|}$$

is the sign of GVD, $n_g$ is the group index, $n_o$ is the refractive index, N is the longitudinal mode number, c is the speed of light in vacuum, γ is the nonlinear coefficient, and $P_{int}$ is the intra-cavity pump power. The listed equations show the dependence of ξ on $f_p$, $f_{rep}$, and $P_{int}$. In a high-Q $Si_3N_4$ microresonator, $P_{int}$ is resonantly enhanced to be as high as 30 W and it is the dominant heat source to change the cavity temperature and subsequently the comb spacing. For instance a pump power variation of 0.12% can result in a 1.6×10$^{-5}$ fractional change in the comb spacing, corresponding to a large cavity temperature change of 1 K. Thus, the $f_{rep}$ stabilization can effectively eliminate the $P_{int}$ fluctuation. In this way, the offset frequency is reduced to just a function of pump frequency once the comb spacing is stabilized. Control of $f_{rep}$ and is thus equivalent to regulation of $f_{rep}$ and $f_{ceo}$ in full stabilization of the microresonator-based frequency comb.

Figure 8C:
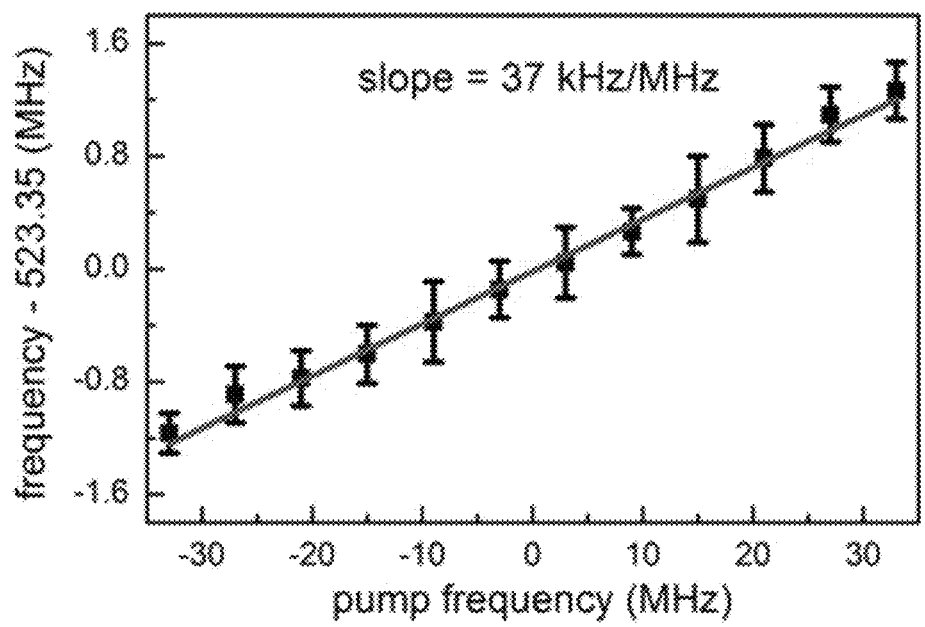
Figure 8D:
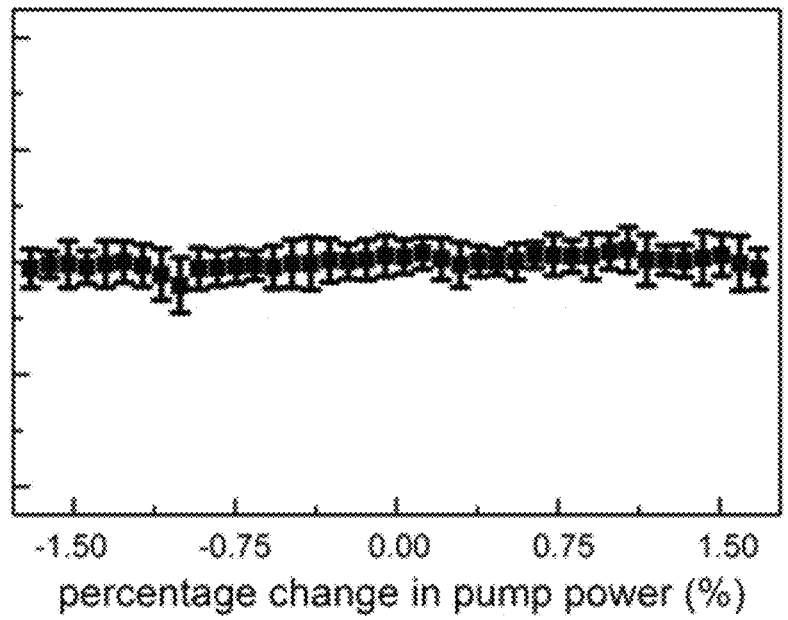

FIGS. 8C and 8D plot the offset frequency as a function of pump frequency and applied pump power, experimentally measured after $f_{rep}$ stabilization. In particular, ten measurements were taken to determine the mean value and the error bars of the measurements are defined as the peak-to-peak deviations from the 10 measurements. Here the pump frequency is not yet stabilized resulting in the error bars in the offset frequency measurements. With respect to FIG. 8C, the pump frequency is stepwise changed by a total of 66 MHz via the PZT of the ECDL. The offset frequency is linearly proportional to the pump frequency with a slope of 37 kHz/MHz. With respect to FIG. 8D, the pump power is stepwise changed by a total of 3.4% via the gain of the EFDA. The offset frequency remains constant within the error bar, verifying the assumption that $f_{rep}$ stabilization effectively eliminates the intra-cavity pump power fluctuation. It's observed that the offset frequency remains constant at different applied pump power but scales linearly with the pump frequency at a slope of 3.7×10$^{-2}$. The measurements validate the assumption that $f_{rep}$ stabilization effectively eliminates the intra-cavity pump power fluctuation and reduces the dependence of $\xi$ to just a function of pump frequency. Mode hybridization in the current multimode Si$_3$N$_4$ microresonator can lead to abrupt increase of local GVD and results in the pinning of primary comb lines. The effect can reduce the slope, i.e. sensitivity, of offset frequency in gauging the pump frequency fluctuation. Nevertheless, the sensitivity is already more than two orders of magnitude larger than the optical frequency division ratio, $\partial f_{rep}/\partial f_{opt}$~10$^{-4}$, and thus the instability of the microresonator-based optical frequency comb $$\delta f_{opt} = \frac{1}{\partial f_{rep}/\partial f_{opt}}\delta f_{rep} + \frac{1}{\partial \xi/\partial f_p}\delta \xi$$

can still be limited by the residual error and the local oscillator of the $f_{rep}$ stabilization loop.

Figure 9A:
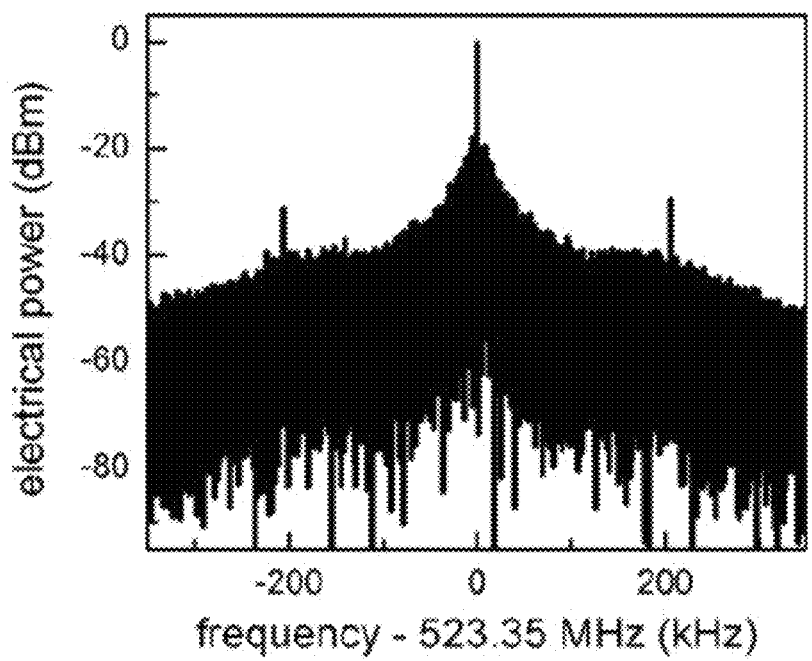
FIGS. 9A-9E illustrate the stabilization of ξ in accordance with certain embodiments of the invention.
Figure 9B:
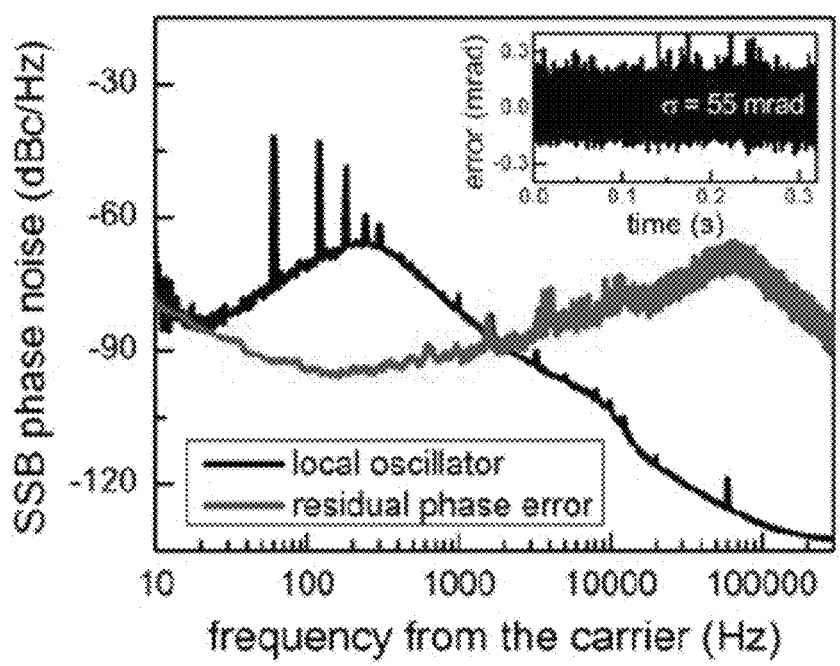
Figure 9C:
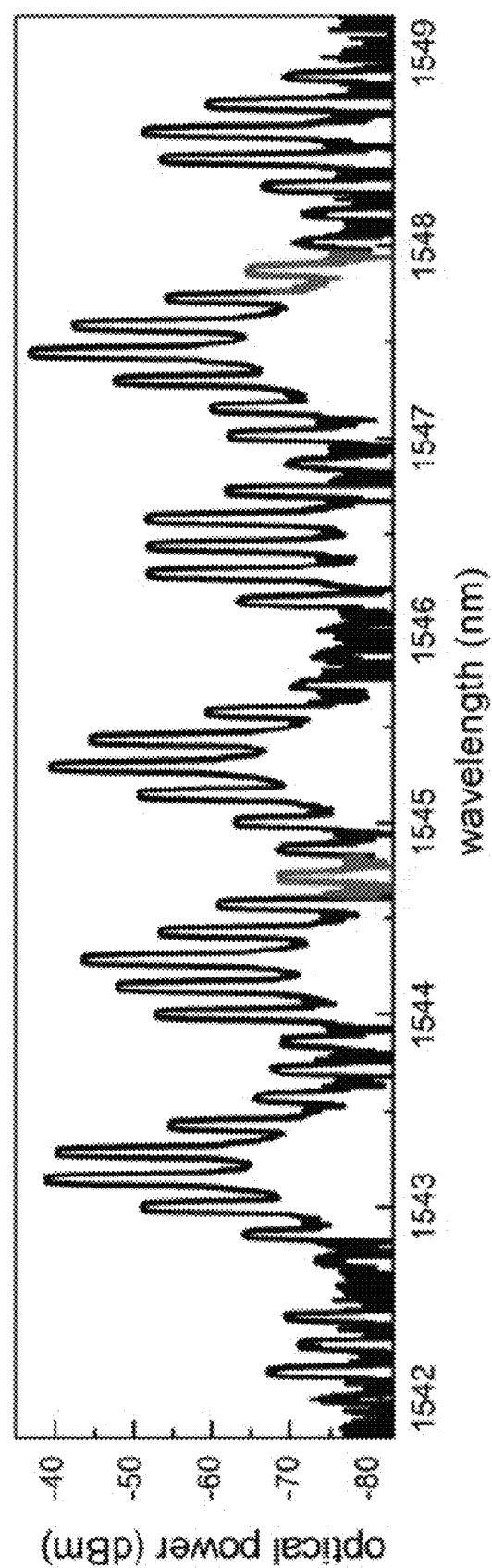
Figure 9D:
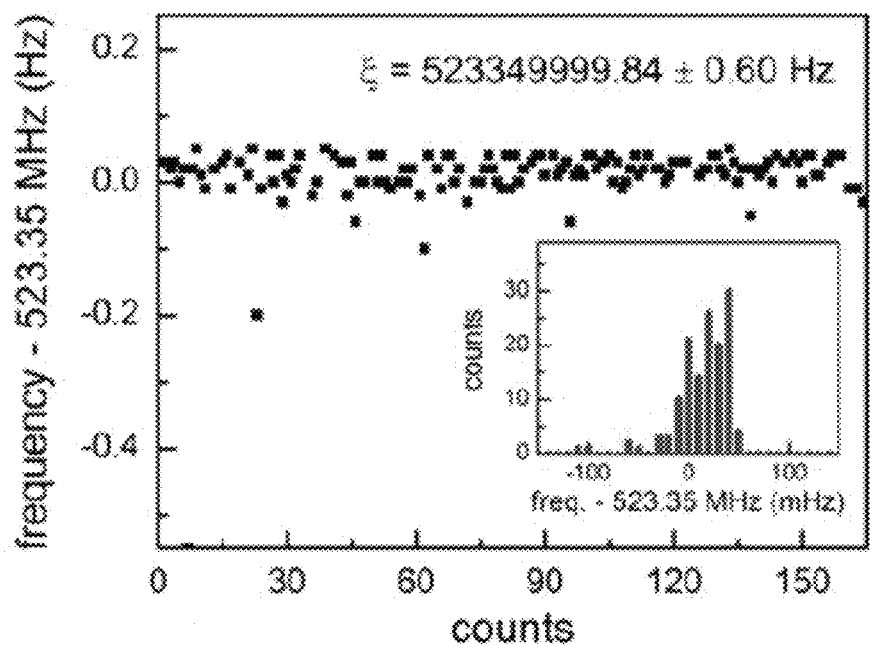
Figure 9E:
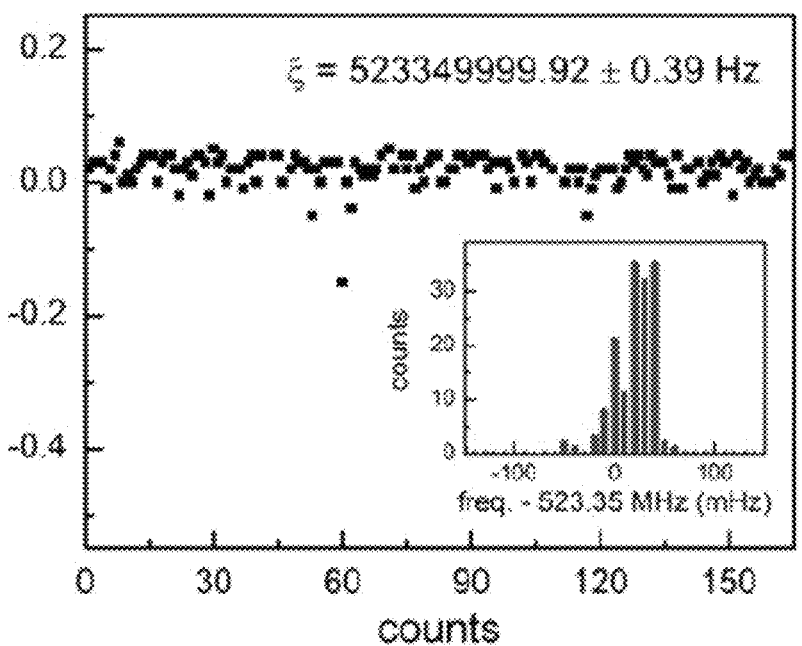

FIGS. 9A-9E illustrate the stabilization of $\xi$ in accordance with embodiments of the invention. To reduce the crosstalk between the two phase-locked loops, a proportional integral corner frequency can be set lower than that of the $f_{rep}$ stabilization loop. A second integrator at 500 Hz can be included to better suppress low frequency noise. Compared to the unstabilized beat note shown in FIG. 8A, the stabilized $\xi$ shows a clear resolution limited coherent spike. The noise oscillation at 205 kHz is the remaining crosstalk derived from the $f_{rep}$ stabilization loop. The single-sideband phase noise of the reference microwave oscillator is plotted in FIG. 9B along with the residual loop error. While the low frequency noise is well suppressed to below the reference, excessive phase noise above 2 kHz from carrier is depicted. The r.m.s. phase error integrated from 6 Hz to kHz is 55 mrad. To verify the uniformity of the offset frequencies, are measured at two distinct spectral regions other than 1553.5 nm where the beat note is used for stabilization. The selected spectral segments (circa 1544.7 nm and 1547.8 nm) are representative as each $\xi$ is generated from the overlap of different groups of secondary comb lines. FIGS. 9D and 9E illustrate counter results and the corresponding histogram analyses. The mean values at 1544.72 nm and 1547.86 nm are 523349999.84 Hz and 523349999.92 Hz respectively, while the beat note at 1553.5 nm is stabilized to 523350000 Hz. Offset frequencies at different spectral regions are identical within a sub-Hz error, confirming the uniformity of $\xi$ across the microresonator-based frequency comb. Phase locking $f_{rep}$ and $\xi$ to low noise microwave oscillators can thereby be completed and it should facilitate the optical frequency stability of the microresonator-based frequency comb.

Figure 10A:
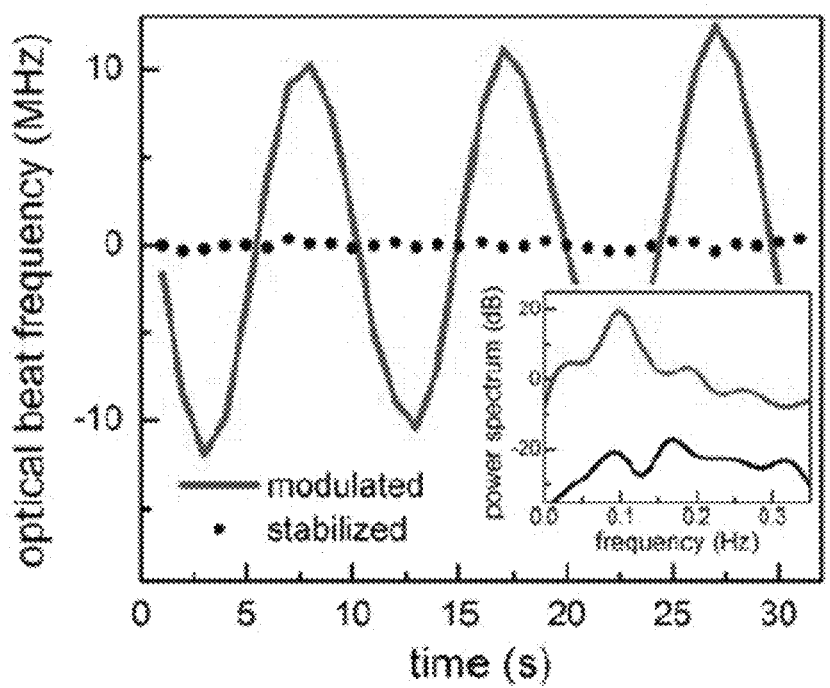
FIGS. 10A-10B illustrate the quantification of the out-of-loop frequency instability of the stabilized microresonator-based frequency comb in accordance with certain embodiments of the invention.
Figure 10B:
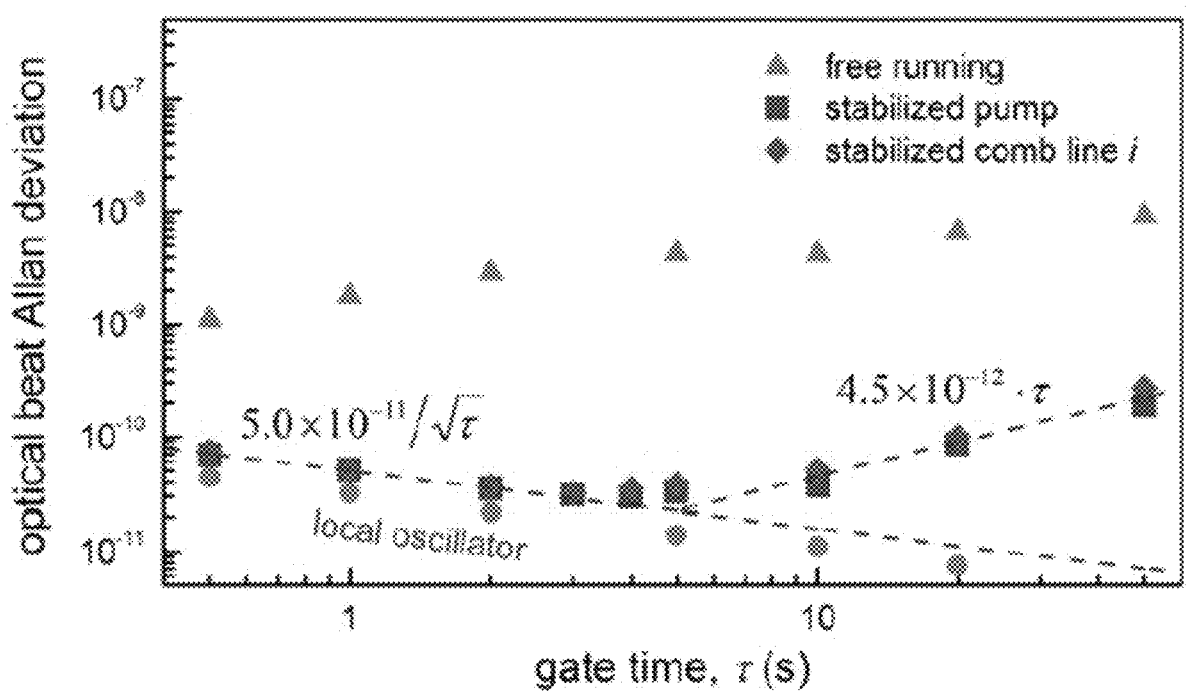

To quantify the out-of-loop frequency instability of the stabilized microresonator-based frequency comb, two comb lines (e.g. pump at 1598 nm and $i^{th}$ comb at 1555 nm) can be compared to the FFC and the heterodyne beat frequencies can be counted with a 10-digit, A-type frequency counter. The FFC can be independently stabilized with the f-2f interferometer technique and where the frequency fractional instability is 10$^{-11}$ at 1 second. FIG. 10A illustrates the more than 20 dB pump frequency noise suppression with both the $f_{rep}$ and $\xi$ phase-locked loops engaged. FIG. 10B further shows the Allan deviations (ADs) of the two stabilized Kerr frequency comb lines. A frequency fractional instability of 5.0×10$^{-11}/\sqrt{\tau}$, close to the 17.9 GHz reference local oscillator, is measured when the gate time is below 5 seconds. No apparent difference is observed between the ADs of the two comb lines 43 nm apart, indicating a good coherence transfer across the Kerr frequency comb. For longer gate times, the ADs show a characteristic linear dependence on the gate time that can be attributed to the uncompensated ambient temperature drift. For instance, considering the current chip holder has a long term temperature stability of <10 mK which can be limited by the resolution of the temperature sensor, a fractional change of 1.2×10$^{-5}$ in the pump power can be necessary to keep the intra-cavity temperature and consequently the $f_{rep}$ constant. Such pump power variation in turn results in a change of 13 kHz in the pump frequency $$\left(\Delta f_p = \frac{\gamma c}{\pi n_g}\Delta P_{int}\right).$$

The estimated frequency fractional instability is on the order of 7×10$^{-11}$ when referenced to the 188 THz optical carrier, in agreement with the asymptotic behavior of the measured AD.

Multiple Mode-Spaced Comb formation

In many embodiments, multiple mode-spaced combs are formed. The general multiple mode-spaced scheme (MMS) of comb formation involves the generation of several sub-comb families with incommensurate spacing between them. This is illustrated in FIG. 11A; as expected, combs evolving via this scheme produce several low frequency RF beats. In particular, FIG. 11A illustrates two sets of combs, that belong to different families, as the two sets of primary comb lines around which the subcombs are formed, are generated independently by the pump. The first set of primary comb lines are formed at an offset of $\Delta_1$ from the pump and the second set are formed at an offset of $\Delta_2$ from the pump, since $\Delta_2$ is not a multiple of $\Delta_1$ and neither $\Delta_2$ nor $\Delta_1$ need to be integral multiples of $f_{rep}$, there are two offset beats generated by beating of subcombs with each other, these offset beats are shown in the schematic as $\xi_1$ and $\xi_2$. If this idea is extended to multiple subcomb families, the generation of multiple RF beatnotes can be expected (and if the subcombs were broad enough, harmonics of the beatnotes can be expected). The comb state that is stabilized, is one with a single offset beat and has just one other subcomb family aside from the sub-comb around the primary comb line as illustrated in FIG. 11B. In particular, FIG. 11B illustrates a special case of MMS comb formation in accordance with embodiments of the invention that results in the generation of a single RF beat note (aside from the beat due to $f_{rep}$) that corresponds to the offset $\xi$ between subcombs. Note that, in this case, only the first set of primary comb lines is formed due to modulation instability via the pump, all other primary comb lines are generated via cascaded four-wave mixing between the pump and the first set of primary comb lines, this mechanism allows for a single offset $\xi$ throughout the comb. This particular state is stabilized due to the strong correlation between the pump frequency and $\xi$ due to the dependence of $\xi$ on $\Delta$, as previously described. This state is not a necessary part of the comb evolution process and is only observed under the right conditions of power and detuning.

Figure 12A:
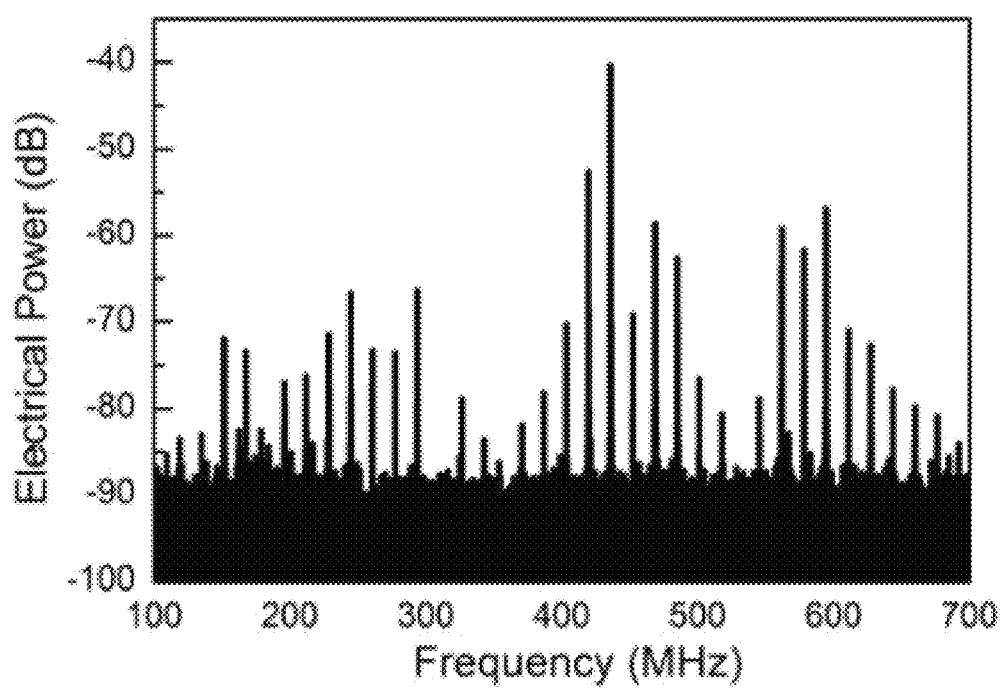
FIGS. 12A-12D illustrate the formation of an RF comb in accordance with certain embodiments of the invention.
Figure 12B:
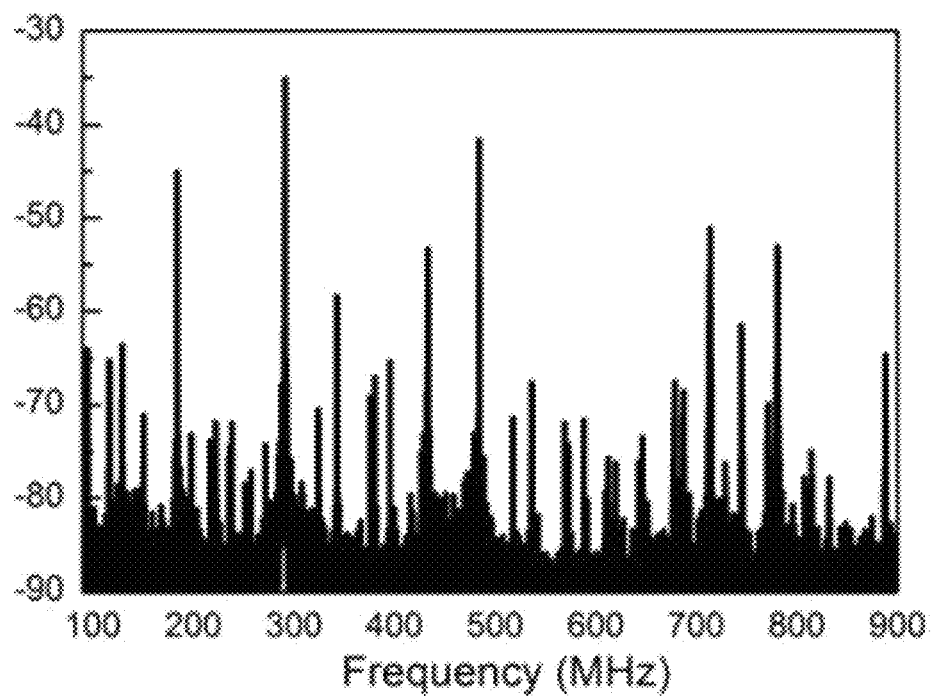
Figure 12C:
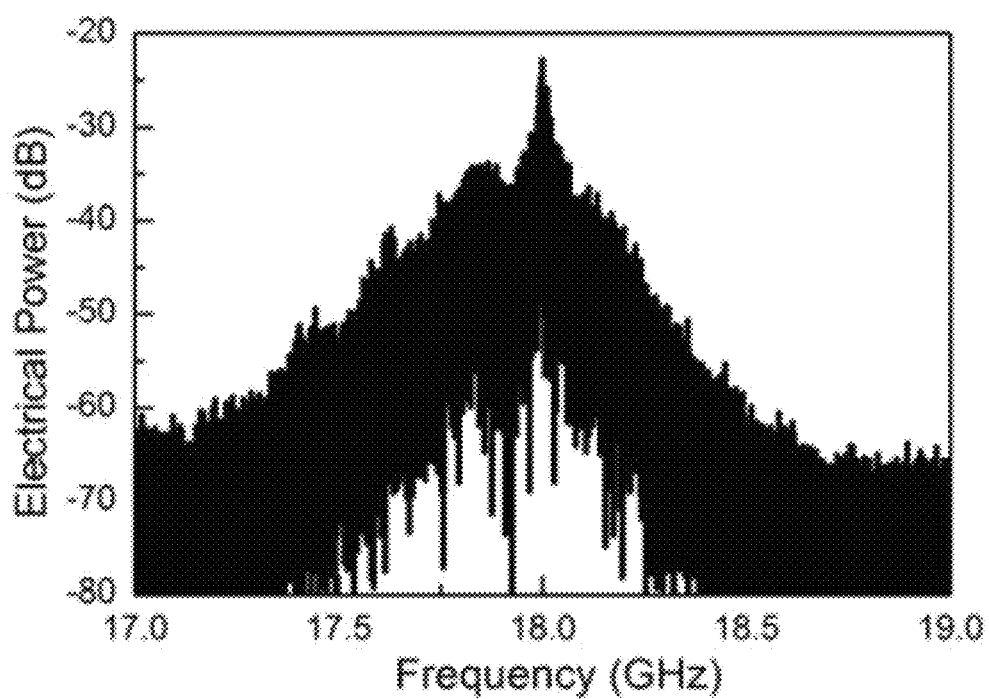
Figure 12D:
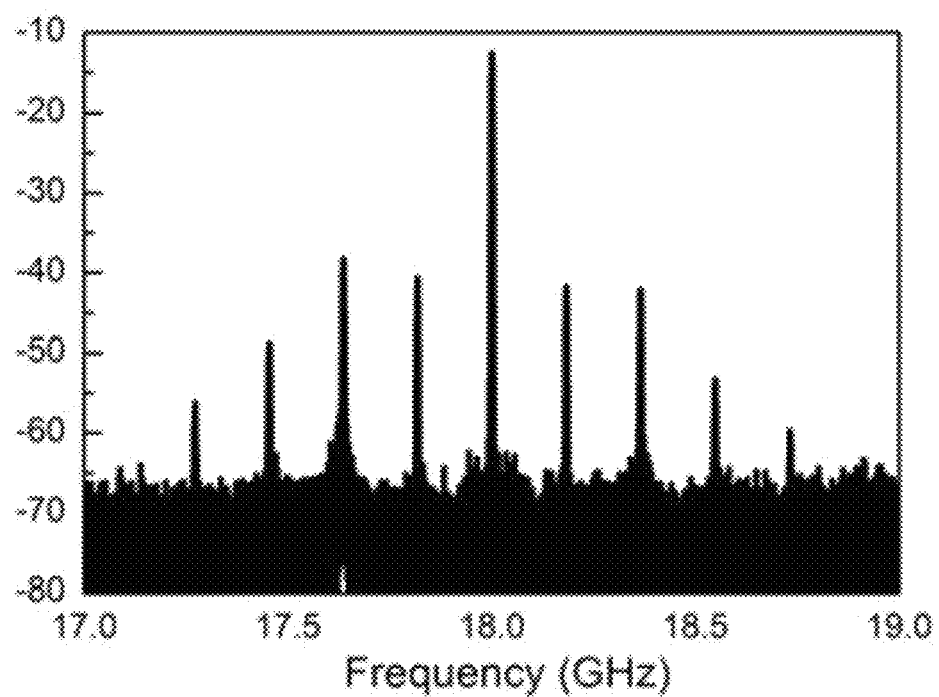

One of the comb states that has been observed generates an equally spaced set of betas spanning around 600 MHz. This 'RF comb' is shown in FIG. 12A. In this particular case, an interesting point to note is that although multiple sub-comb families exist in this state, the RF beats being equally spaced indicates a relationship between the different sub-comb families. As detuning is changed this state changes to one with higher noise that does not show a regular equally spaced comb structure in the RF domain; this is shown in FIG. 12B. This state then eventually evolves into one with continuous low frequency noise, the RF spectrum at the repetition rate of such a comb is shown in FIG. 12C. In addition, states similar to the one used for stabilization are observed, having a strong low frequency RF beat in addition to beat due to $f_{rep}$; this circumstance is depicted in FIG. 12D, but exhibiting slightly different behavior with regards to degree of correlation between pump and the offset beat.

While the above descriptions and associated figures have depicted the implementation of particular configurations of self-referencing microresonator-based optical frequency combs, it should be clear that any of a variety of configurations for self-referencing microresonator-based optical frequency combs can be implemented in accordance with embodiments of the invention. More generally, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

The invention claimed is:

1. An all-microwave stabilized microresonator-based optical frequency comb, comprising:
    an optical pump configured to generate pulses of light:
    a microresonator including an input configured to receive pulses generated by an optical pump and an output configured to generate an optical frequency comb signal characterized by $f_{rep}$ and $\xi$, where:
        $f_{rep}$ describes spacing of frequency components in the optical frequency comb, and
        the optical frequency comb includes a primary comb and a plurality of subcombs and $\xi$ is a frequency offset between subcombs; and
    two phase locked loops that phase lock $f_{rep}$ and $\xi$ to low noise microwave oscillators by modulating output power and pump frequency of the optical pump.

2. The all-microwave stabilized microresonator-based optical frequency comb of claim 1, wherein optical pump output power is modulated using an electro-optical modulator.

3. The all-microwave stabilized microresonator-based optical frequency comb of claim 1, wherein the optical pump comprises an external cavity diode laser (ECDL).

4. The all-microwave stabilized microresonator-based optical frequency comb of claim 3, wherein the pump frequency is controlled via a diode current of the ECDL.

5. The all-microwave stabilized microresonator-based optical frequency comb of claim 1, wherein respective intrinsic offset frequencies $\xi$ are uniquely defined and resemble corresponding carrier envelope offset frequencies, $f_{ceo}$ after the stabilization of respective repetition frequencies, $f_{rep}$.

6. The all-microwave stabilized microresonator-based optical frequency comb of claim 1, wherein pump power $P_p$ and pump frequency $f_p$ are implemented such that only a single set of respective primary comb lines is generated, resulting in the unique definition of a respective intrinsic offset frequency, $\xi$.

7. The all-microwave stabilized microresonator-based optical frequency comb of claim 1, wherein the offset frequency $\xi$ is in the RF domain.

8. The all-microwave stabilized microresonator-based optical frequency comb of claim 1, wherein the primary comb lines are separated by $\Delta$ and a secondary comb line is spaced by $f_{rep}$, wherein $\Delta$ is not an integer multiple of $f_{rep}$ and the frequency comb exhibits a single intrinsic offset frequency, $\xi$.

9. The all-microwave stabilized microresonator-based optical frequency comb of claim 1, further comprising using additional slow feedback through the gain of an erbium-doped fiber amplifier (EDFA) and a piezoelectric transducer (PZT) of an ECDL to extend the stable operation time of the phase-locked loops.

10. The all-microwave stabilized microresonator-based optical frequency comb of claim 9, wherein the control units of the slow feedback loops are the EDFA gain and the PZT.

11. The all-microwave stabilized microresonator-based optical frequency comb of claim 1, further comprising utilizing PI$^2$D control servos for feedback in the $f_{rep}$ and $\xi$ phase lock loops.

12. The all-microwave stabilized microresonator-based optical frequency comb of claim 1, wherein to isolate the microresonator from ambient thermal fluctuations, the chip is mounted on a temperature-controlled chip-holder and enclosed in an acrylic chamber.

13. The all-microwave stabilized microresonator-based optical frequency comb of claim 1, wherein the offset frequency, $\xi$, is linked with the primary comb line spacing, $\Delta$, by the constitutive relation $$\xi = \Delta - \left\lfloor \frac{\Delta}{f_{rep}} \right\rfloor f_{rep}.$$

14. The all-microwave stabilized microresonator-based optical frequency comb of claim 1, wherein a proportional integral corner frequency is set lower than that of the $f_{rep}$ stabilization loop to reduce the crosstalk between the two phase-locked loops.

15. The all-microwave stabilized microresonator-based optical frequency comb of claim 1, wherein multiple mode-spaced combs are formed comprising several subcomb families with incommensurate spacing between them.

16. The all-microwave stabilized microresonator-based optical frequency comb of claim 15, wherein a first set of primary comb lines are formed at an offset of $\Delta_1$ from the pump and a second set are formed at an offset of $\Delta_2$ from the pump, wherein $\Delta_2$ is not a multiple of $\Delta_1$ and neither $\Delta_2$ nor $\Delta_1$ are integral multiples of $f_{rep}$, and two offset beats $\xi_1$ and $\xi$ are generated by beating of subcombs with each other.

17. The all-microwave stabilized microresonator-based optical frequency comb of claim 16, wherein only the first set of primary comb lines is formed due to modulation instability via the pump, and all other primary comb lines are generated via cascaded four-wave mixing between the pump and the first set of primary comb lines, which allows for a single offset $\xi$ throughout the comb.

* * * * *